(12) United States Patent
Choi

(10) Patent No.: US 7,948,289 B2
(45) Date of Patent: May 24, 2011

(54) DELAY LOCKED LOOP CIRCUIT AND SEMICONDUCTOR MEMORY DEVICE USING THE SAME

(75) Inventor: Hoon Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/490,619

(22) Filed: Jun. 24, 2009

(65) Prior Publication Data

US 2010/0295588 A1    Nov. 25, 2010

(30) Foreign Application Priority Data

May 21, 2009 (KR) .................. 10-2009-0044468

(51) Int. Cl.
*H03L 7/06* (2006.01)
(52) U.S. Cl. ...................................... 327/158; 327/149
(58) Field of Classification Search .................. 327/149, 327/158
See application file for complete search history.

(56) References Cited

U.S. PATENT DOCUMENTS

| | | | | |
|---|---|---|---|---|
| 5,552,727 A | * | 9/1996 | Nakao | 327/159 |
| 5,995,424 A | * | 11/1999 | Lawrence et al. | 365/201 |
| 7,099,232 B2 | * | 8/2006 | Kwak | 365/194 |
| 7,724,050 B2 | * | 5/2010 | Lee | 327/158 |
| 2005/0249027 A1 | * | 11/2005 | Kwak | 365/233 |
| 2010/0201414 A1 | * | 8/2010 | Oh | 327/158 |

FOREIGN PATENT DOCUMENTS

| | | |
|---|---|---|
| KR | 100295210 | 7/2001 |
| KR | 1020070038669 | 4/2007 |

OTHER PUBLICATIONS

Notice of Preliminary Rejection issued from Korean Intellectual Property Office on Dec. 22, 2010.

* cited by examiner

*Primary Examiner* — Lincoln Donovan
*Assistant Examiner* — Adam D Houston
(74) *Attorney, Agent, or Firm* — IP &T Group LLP

(57) ABSTRACT

The present invention relates to a delay locked loop (DLL) circuit. The DLL circuit includes a phase comparator configured to compare a phase of a source clock with a phase of a feedback clock and generate a delay locking signal based on the comparison result, a clock delay configured to delay the source clock in response to the delay locking signal for locking delay, output the delayed source clock as a delay locked clock, and generate a delay end signal when a delay amount has reached a delay limit, a delay replica model configured to reflect a delay time of an output path of the source clock at the delay locked clock and output the reflected clock as the feedback clock, and a delay locking operation controller configured to terminate a delay locking operation in response to the delay locking signal and the delay end signal.

26 Claims, 7 Drawing Sheets

(A)

(B)

DELAY LOCKED LOOP CIRCUIT AND SEMICONDUCTOR MEMORY DEVICE USING THE SAME

CROSS-REFERENCE TO RELATED APPLICATION

The present application claims priority of Korean patent application number 10-2009-0044468, filed on May 21, 2009, which disclosure is incorporated herein by reference in its entirety.

BACKGROUND OF THE INVENTION

The present invention relates to semiconductor design technology, and more particularly, to a delay locked loop circuit of a semiconductor device.

A synchronous semiconductor memory device such as a DDR SDRAM (Double Data Rate Synchronous DRAM) transmits data to external devices using an internal clock that is synchronized with an external clock inputted from an external device such as a memory controller CTRL.

In order to stably transmit data between a memory and a memory controller, it is important to synchronize data outputted from the memory with an external clock supplied from the memory controller to the memory.

A memory outputs data synchronized with an internal clock. Even if the internal clock is synchronized with an external clock when the internal clock is supplied to the memory, the internal clock may be delayed while passing through components of the memory. Therefore, when the internal clock is outputted, the internal clock may become desynchronized.

Therefore, it is necessary to synchronize the internal clock with the external clock. The internal clock is compensated for a time taken for data to travel along a bus in order to accurately place the delayed internal clock at an edge or a center of the external clock supplied from a memory controller.

In order to compensate for the delayed internal clock, a clock synchronizing circuit was introduced. The clock synchronizing circuit includes a phase locked loop circuit (PLL) and a delay locked loop circuit (DLL).

Between the phase locked loop (PLL) circuit and the delay locked loop (DLL) circuit, the phase locked loop (PLL) circuit is used when a frequency of an internal clock is different from that of an external clock because the phase locked loop (PLL) circuit can multiply a frequency. When the internal clock and the external clock have the same frequency, the delay locked loop circuit (DLL) is generally used because the delay locked loop circuit (DLL) is less sensitive to noise and occupies comparatively small area.

Since the internal clock and the external clock have the same frequency in case of a semiconductor memory device, the delay locked loop (DLL) circuit is generally used for the semiconductor memory device as the clock synchronizing circuit. For a semiconductor memory device, a register-controlled delay locked loop DLL circuit is widely used due to following advantages. The register-controlled delay locked loop (DLL) circuit includes a register for storing a locked delay value. The register-controlled delay locked loop circuit stores the locked delay value in the register when power is interrupted. After the power is supplied again, the register-controlled delay locked loop circuit loads and uses the stored delay value to lock the internal clock. Therefore, a semiconductor memory device can start clock synchronization with a comparatively small phase difference between the internal clock and the external clock when the semiconductor memory device performs an initial operation. After the initial operation, the register-controlled delay locked loop circuit can control a variable range of a delay value stored in the register according to a phase difference between the internal clock and the external clock. Therefore, the register-controlled delay locked loop circuit can synchronize the internal clock and the external clock in comparatively short time.

FIG. 1 is a block diagram illustrating a register-controlled delay locked loop (DLL) circuit according to the related art.

Referring to FIG. 1, the register-controlled delay locked loop (DLL) circuit according to the related art includes a phase comparator 100, a clock delay 120, and a delay replica model 140. The phase comparator 100 compares a phase of a source clock REFCLK with a phase of a feedback clock FBCLK and generates a delay locking signal DELAY_LOCK_CTRL corresponding to the comparison result. The clock delay 120 delays the source clock REFCLK in response to a delay locking signal for locking delay and outputs the delayed clock as a delay locked clock DLLCLK. The delay replica model 140 reflects a delay time of an output path of the source clock REFLCK at the delay locked clock DLLCLK and outputs the reflected clock as a feedback clock FBCLK.

Hereinafter, a delay locking operation of the register control delay locked loop circuit according to the related art will be described with reference to FIG. 1. Before locking, a phase of a source clock REFCLK does not match that of a feedback clock FBCLK. The register control delay locked loop circuit delays the phase of the source clock REFCLK and outputs the delay source clock as a delay locked clock DLLCLK in order to synchronize a reference edge of the source clock REFCLK with a reference edge of a feedback clock FBCLK. Here, the reference edge of the source clock REFCLK is generally a rising edge. However, the reference edge may be a falling edge. Since the delay locked clock DLLCLK is reflected with the delay condition of a source clock path and outputted as the feedback clock FBCLK, the phase difference between the source clock REFCLK and the feedback clock FBCLK is gradually reduced by increasing a delay amount for delaying a phase of the source clock REFCLK.

However, the register-controlled delay locked loop (DLL) circuit according to the related art is set up with a maximum delay amount that can be applied until outputting the delay locked clock DLLCLK by delaying the phase of the source clock REFCLK. If the phase of the source clock REFCLK is not synchronized with the phase of the feedback clock FBCLK before the maximum delay amount is applied, the register-controlled delay locked loop (DLL) circuit according to the related art may not be able to terminate a delay locking loop operation.

SUMMARY OF THE INVENTION

Embodiments of the present invention are directed to providing a scheme for controlling an operation of a register-controlled delay locked loop circuit by sensing a phase difference between a source clock REFCLK inputted to the register-controlled delay locked loop circuit and a delay locked clock DLLCLK outputted from the register-controlled delay locked loop circuit.

In accordance with an aspect of the present invention, there is provided a delay locked loop circuit including, a phase comparator configured to compare a phase of a source clock with a phase of a feedback clock and generate a delay locking signal based on the comparison result; a clock delay configured to delay the source clock in response to the delay locking signal for locking delay, output the delayed source clock as a delay locked clock, and generate a delay end signal when a delay amount has reached a delay limit; a delay replica model configured to reflect a delay time of an output path of the source clock at the delay locked clock and output the reflected clock as the feedback clock; and a delay locking operation controller configured to terminate a delay locking operation in response to the delay locking signal and the delay end signal.

In accordance with another aspect of the present invention, there is provided a semiconductor memory device, including a phase comparator configured to compare a phase of a source clock with a phase of a feedback clock and generate a delay locking signal corresponding to the comparison result; a clock delay configured to delay the source clock and output the delayed source clock as a delay locked clock in response to the delay locking signal for locking delay, and generate a delay end signal when a delay amount has reached a delay limit; a delay replica model configured to reflect a delay time of an output path of the source clock at the delay locked clock and output the reflected clock as the feedback clock; and an internal data output unit configured to synchronize internal data at the delay locked clock and output the synchronized data, and configured to be turned On/Off in response to the delay locking signal and the delay end signal.

In accordance with still another aspect of the present invention, there is provided a delay locked loop circuit, including a supply voltage selector configured to selectively supply one of an external supply voltage and an internal supply voltage as a selected supply voltage in response to a delay locking signal and a delay end signal where the internal supply voltage has a voltage level lower than a voltage level of the external supply voltage; a phase comparator configured to use the selected supply voltage from the supply voltage selector as power source, compare a phase of a source clock with a phase of a feedback clock, and generate the delay locking signal corresponding to the comparison result; a clock delay configured to use the selected supply voltage from the supply voltage selector as power source, and configured to delay the source clock in response to the delay locking signal for locking delay and output the delayed source clock as a delay locked clock, and configured to generate the delay end signal when a delay amount has reached a delay limit; and a delay replica model configured to reference a delay time of an output path of the source clock at the delay locked clock and output the reflected clock as the feedback clock.

In accordance with a further aspect of the present invention, there is provided a delay locked loop circuit, including a clock driver configured to output an external clock as a source clock by driving the external clock during a delay locking enable period corresponding to a delay end signal and configured to output the external clock as a delay locked clock by driving the external clock during a delay locking disable period; a phase comparator configured to compare a phase of the source clock with a phase of a feedback clock and generate a delay locking signal corresponding to the comparison result; a clock delay configured to delay the source clock in response to the delay locking signal for locking delay and output the delayed clock as the delay locked clock and configured to generate a delay end signal when a delay amount has reached a delay limit; and a delay replica model configured to reflect a delay time of an output path of the source clock at the delay locked clock and output the reflected clock as the feedback clock.

DESCRIPTION OF SPECIFIC EMBODIMENTS

Other objects and advantages of the present invention can be understood by the following description, and become apparent with reference to the embodiments of the present invention.

Figure 1:
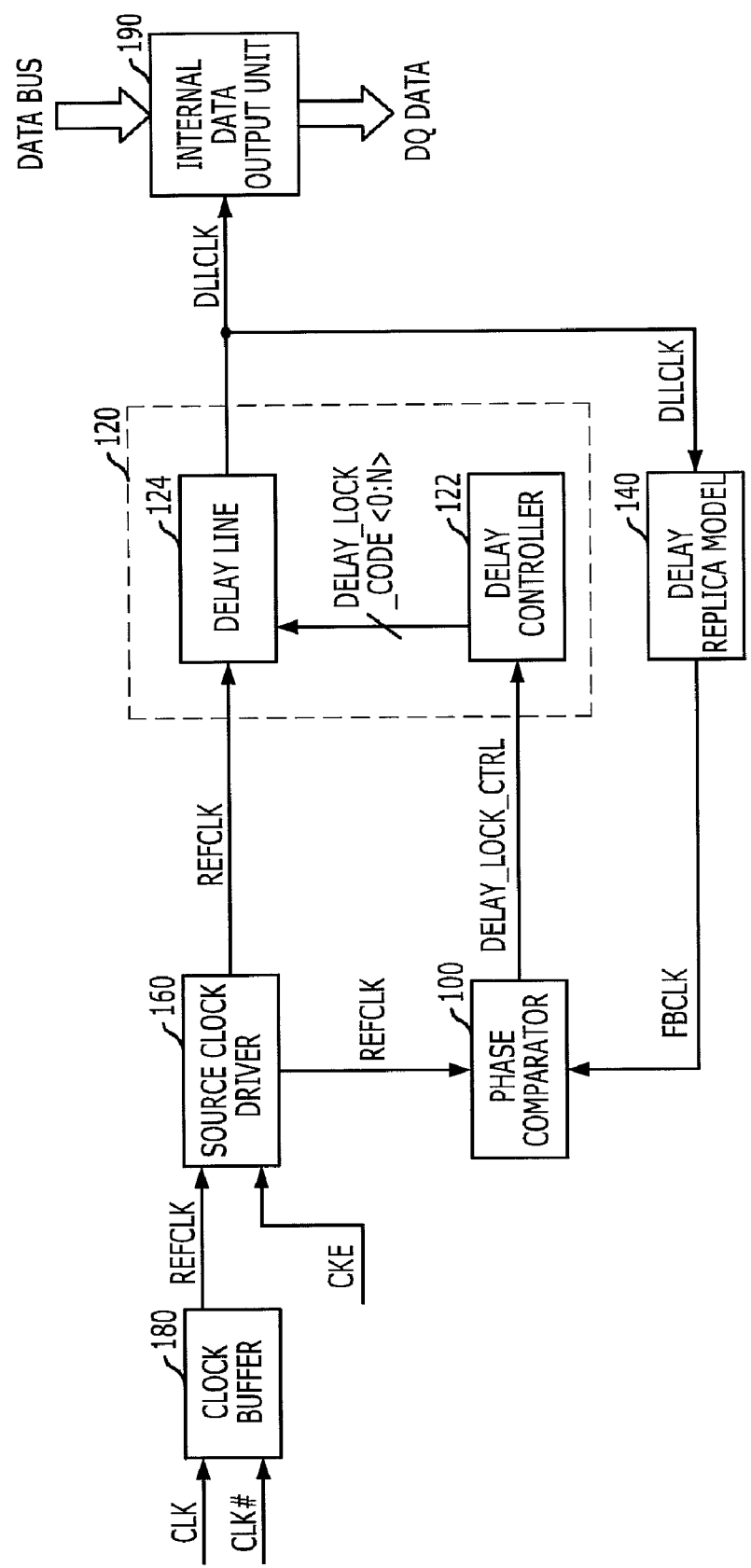
FIG. 1 is a block diagram illustrating a register-controlled delay locked loop (DLL) circuit according to the related art.
Figure 2:
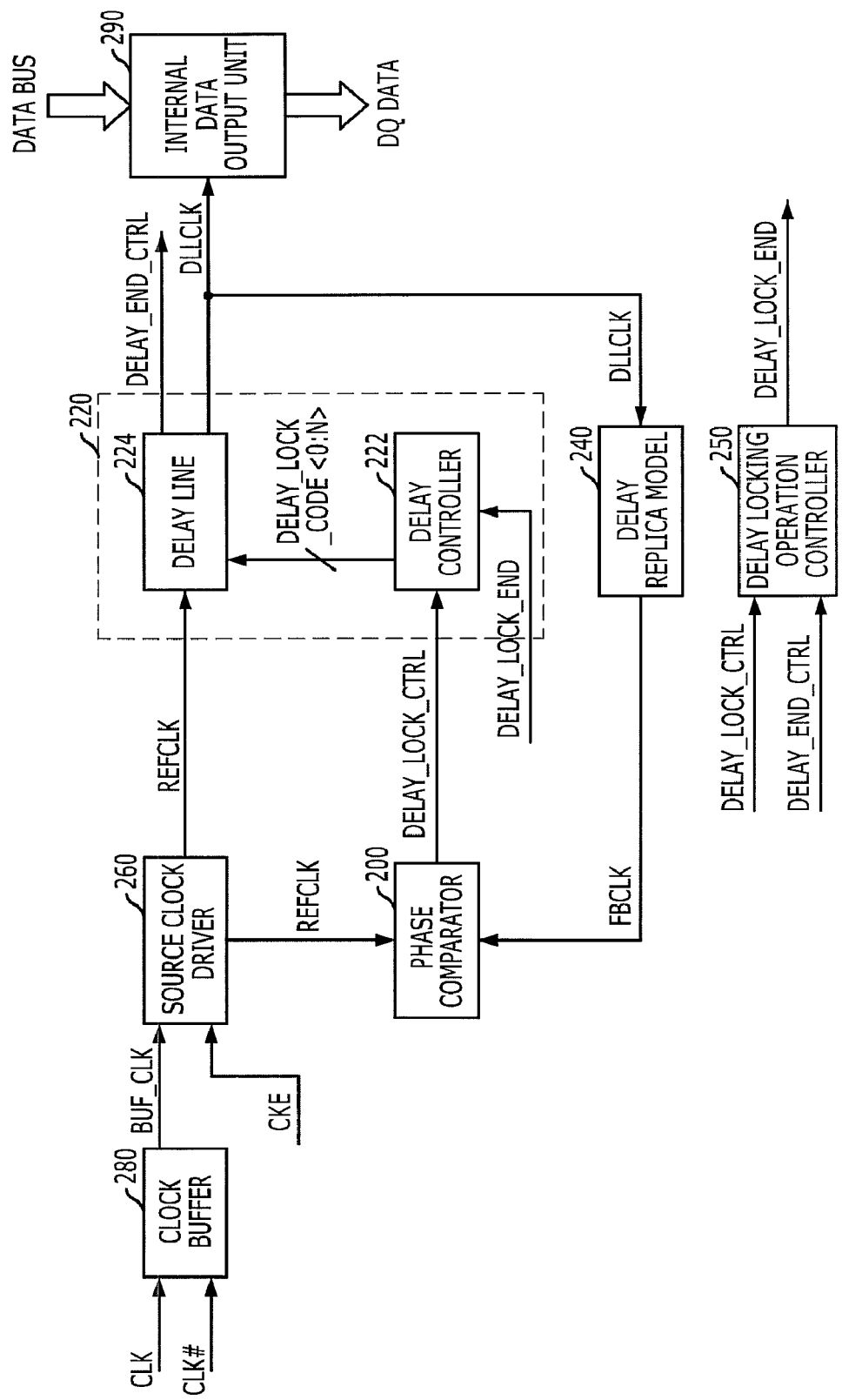
FIG. 2 is a block diagram illustrating a register-controlled delay locked loop (DLL) circuit in accordance with a first embodiment of the present invention.

FIG. 2 is a block diagram illustrating a register-controlled delay locked loop (DLL) according to a first embodiment of the present invention.

Referring to FIG. 2, the register-controlled delay locked loop (DLL) according to the first embodiment includes a clock buffer 280, a source clock driver 260, a phase comparator 200, a clock delay 220, a delay replica model 240, and a delay locking operation controller 250.

The clock buffer 280 buffers a clock supplied from an external device. The source clock driver 260 drives an output clock BUF_CLK of the clock buffer 280 in response to a clock enable signal CKE to output as a source clock REFCLK. The phase comparator 200 compares a phase of a source clock REFCLK with a phase of a feedback clock FBCLK and generates a delay locking signal DELAY_LOCK_CTRL based on the comparison result. The clock delay 220 delays the source clock REFCLK in response to the delay locking signal DELAY_LOCK_CTRL and outputs the delayed source clock as a delay locked clock DLLCLK and generates a delay end signal DELAY_END_CTRL in response to reaching a delay limit. The delay replica model 240 outputs a feedback clock FBCLK by reflecting a delay time of an output path of the source clock REFCLK at the delay locked clock DLLCLK. The delay locking operation controller 250 terminates a delay locking operation in response to the delay locking signal DELAY_LOCK_CTRL and the delay end signal DELAY_END_CTRL. More specifically, the clock buffer 280 generates a clock BUF_CLK used internally by buffering clocks CLK and CLK# supplied from an external device.

The source clock driver 260 outputs a buffered clock BUF_CLK as a source clock REFCLK during a period where a clock enable signal CKE is activated. The source clock driver 260 does not output the buffered clock BUF_CLK as a source clock REFCLK during a period where a clock enable signal CKE is inactivated. That is, the source clock REFCLK toggles identically to the buffered clock BUF_CLK during the activation period of the clock enable signal CKE. On the contrary, the source clock REFCLK do not toggle, irrespective of the buffered clock BUF_CLK, in the inactivation period of the clock enable signal CKE.

For illustration purposes, a clock enable signal CKE may always sustain an activation state in a normal operation of a semiconductor memory device. However, the clock enable signal CKE may be inactivated in a specific operation mode such as a power down mode for reducing power consumption of a semiconductor memory device.

The phase comparator 200 activates a delay locking signal DELAY_LOCK_CTRL to logic high and outputs the activated delay locking signal DELAY_LOCK_CTRL when a reference edge of a feedback clock FBCLK is behind a reference edge of a source clock REFCLK at an update time, which is repeated at a predetermined interval while performing a delay locking operation. Here, the reference edge of the source clock REFCK generally indicates a rising edge. However, it is not limited thereto. The reference edge of the source clock REFCK may be a falling edge. Also, the phase comparator 200 inactivates the delay locking signal DELAY_LOCK_CTRL to logic low and outputs the inactivated delay locking signal DELAY_LOCK_CTRL when a reference edge of feedback clock FBCLK is ahead of a reference edge of the source clock REFCLK at an update time, which is repeated at a predetermined interval while a delay locking operation is performed.

When a delay end signal DELAY_END_CTRL outputted from a delay line in the clock delay 220 is inactivated to logic low, the delay locking operation controller 250 locks a delay amount of the clock delay 220 and terminates the delay locking operation by activating a signal DELAY_LOCK_END to logic high. Here, the signal DELAY_LOCK_END is outputted when the delay locking signal DELAY_LOCK_CTRL is repeatedly changed from an activation state of logic high to an inactivation state of logic low while the update time is repeated predetermined times during the performance of the delay locking operation.

When the delay end signal DELAY_END_CTRL outputted from a delay line 220 in the clock delay is activated to logic high, the delay locking operation controller 250 also locks a delay amount of the clock delay 220 and terminates a delay fixing operation by activating a signal DELAY_LOCK_END to logic high, which is outputted regardless of the logic level of the delay locking signal DELAY_LOCK_CTRL. The clock delay 220 changes a value of a delay locking code DELAY_LOCK_CODE<0:N> formed of a plurality of bits in response to the delay locking signal DELAY_LOCK_CTRL. The clock delay 220 includes a delay controller 222 and a delay line 224. The delay controller 222 locks a value of delay locking code DELAY_LOCK_CODE<0:N> in response to an output signal DELAY_LOCK_END of the delay locking operation controller 250. The delay line 224 delays a source clock REFCLK by as much as a delay amount corresponding to the value of the delay locking code DELAY_LOCK_CODE<0:N>. Here, when the value of delay locking code DELAY_LOCK_CODE<0:N> is larger than a value of a delay limit, the delay line 224 activates the delay end signal DELAY_END_CTRL.

The delay controller 222 changes a value of delay locking code DELAY_LOCK_CODE<0:N> in response to a delay locking signal DELAY_LOCK_CTRL at a update time, which is repeated at a predetermined interval in the inactivation state of the output signal DELAY_LOCK_END of the delay locking operation controller 250 during the delay locking operation is performed. The delay controller 222 does not change the value of delay locking code DELAY_LOCK_CODE<0:N> regardless of the update time and regardless of a value of the delay locking signal DELAY_LOCK_CTRL in the activation state (logic high) of the output signal DELAY_LOCK_END of the delay locking operation controller 250 during the delay locking operation is performed. Further, the delay controller 222 does not change the value of delay locking code DELAY_LOCK_CODE<0:N> regardless of the update time and regardless of the value of delay locking signal DELAY_LOCK_CTRL after the delay locking operation ends.

That is, if the delay locking operation is performed and if the output signal DELAY_LOCK_END of the delay locking operation controller 250 is inactivated to logic low, the delay controller 222 increases the value of delay locking code DELAY_LOCK_CODE<0:N> when the delay locking signal DELAY_LOCK_CTROL is activated to logic high at every update time, which is repeated at a predetermined interval. Also, the delay controller 222 decreases the value of delay locking code DELAY_LOCK_CODE<0:N> when the delay locking signal DELAY_LOCK_CTRL is inactivated to logic low at every update time, which is repeated at a predetermined interval.

The delay line 224 delays a source clock REFCLK by as much as a delay amount corresponding to a value of the delay locking code DELAY_LOCK_CODE<0:N> and outputs the delayed source clock REFCLK as a delay locked clock DLLCLK. Here, the delay amount corresponding to the value of delay locking code DELAY_LOCK_CODE<0:N> should be set to a comparative value.

For example, it is assumed that the delay locking code DELAY_LOCK_CODE<0:N> is a four-bit signal. Under this assumption, if the value of the delay locking code DELAY_LOCK_CODE<0:N> is '0 0 0 0', the delay line 224 may be set to not delay the source clock REFCLK and output the source clock REFCLK as a delay locked clock DLLCLK. The delay line 224 may be set to delay the source clock REFCLK more and output the delayed source clock REFCLK as the delay locked clock DLLCLK as the value of the delay locking code DELAY_LOCK_CODE<0:N> increases for example from '0 0 0 1', '0 0 1 0', '0 0 1 1', '0 1 0 0', . . . , to '1 1 1 1'. Here, the delay locking code DELAY_LOCK_CODE<0:N> may have a predetermined initial value at a beginning of the delay locking operation. In general, the initial value may be set as a middle value such as '0 1 1 0' rather than the smallest value '0 0 0 0'.

Even if it is not shown in the drawing, the delay line 224 may include a plurality of unit delays. In this case, the delay line 224 may be set to delay the source clock REFCLK longer and output the delayed source clock REFCLK as the delay locked clock DLLCLK as the value of the delay locking code DELAY_LOCK_CODE<0:N> increases. On the contrary, the delay line 224 may be set to delay the source clock REFCLK less by using less number of the unit delays and output the delayed source clock REFCLK as the delay locked clock DLLCLK as the value of the delay locking code DELAY_LOCK_CODE<0:N> decreases. The number of the unit delays in the delay line 224 may be set according to design needs. The number of the unit delay may not be changed after being set up during the initial design. Also, the size of the delay line 224 increases in proportion to the number of unit delays. Therefore, it is inefficient to increase the number of unit delays without limitation.

Therefore, it is desirable to set a delay limit. The limit delay limits a delay amount of the delay line 224 to delay the source clock REFCLK. If a phase of a source clock REFLCK is not synchronized with a phase of a feedback clock FBCLK after a delay amount has reached the delay limit like the related art, a value of the delay locking code DELAY_LOCK_CODE<0:N> may increase continually. In this case, a delay locking operation will never terminate.

In order to overcome such a problem of the related art, the delay line 224 according to the first embodiment activates the delay end signal DELAY_END_CTRL to logic high and outputs the activated delay end signal DELAY_END_CTRL if a delay amount has reached the delay limit. At the same time, the delay locking operation controller 250 activate a signal DELAY_LOCK_END to logic high and outputs the activated signal DELAY_LOCK_END in response to the activation of the delay end signal DELAY_END_CTRL and the delay controller 222 locks the value of delay locking code DELAY_LOCK_CODE<0:N> in response to the activation of the signal DELAY_END_CTRL outputted from the delay locking operation controller 250. As a result, the delay locking operation is forcedly terminated.

As described above, the register-controlled delay locked loop DLL according to the first embodiment can forcedly terminal the delay locking operation when the register-controlled delay locked loop senses that a phase difference between the source clock REFCK and the outputted delay locked clock DLLCLK has reached a maximum value. In the foregoing manner, the resister controlled delay locked loop DLL according to the first embodiment can prevent the delay locking operation from unlimitedly repeating.

When the delay amount of the delay line 224 has reached the delay limit, the delay locking operation is terminated by activating the delay end signal DELAY_END_CTRL and the output of the delay locking operation controller 250 to logic high. In this case, the phase of the source clock REFCLK is not synchronized with the phase of the feedback clock FBCLK even if the delay locking operation is terminated. Therefore, a phase of DQ data outputted from an internal data output unit 290 may not be synchronized with external clocks CLK and CLK#. Even if the phase of DQ data is not synchronized with the external clocks CLK and CLK#, the register-controlled delay locked look according to the first embodiment can still effectively perform the delay locking operation. It will be described in detail with reference to FIG. 7.

Figure 7:
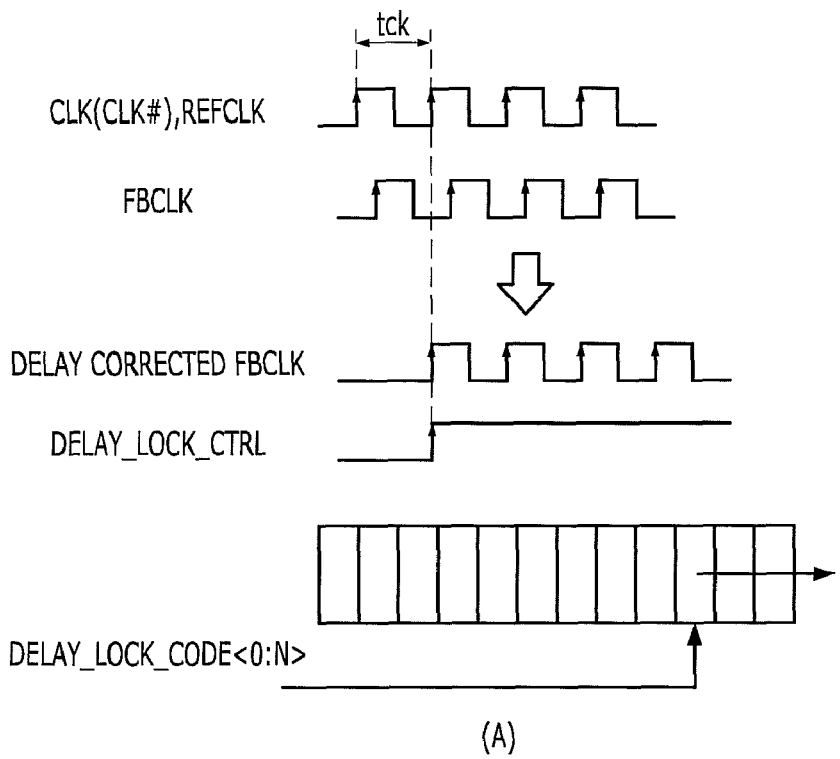
FIG. 7 is a timing diagram for describing a delay locking operation of a typical delay locked loop (DLL) circuit.
Figure 7:
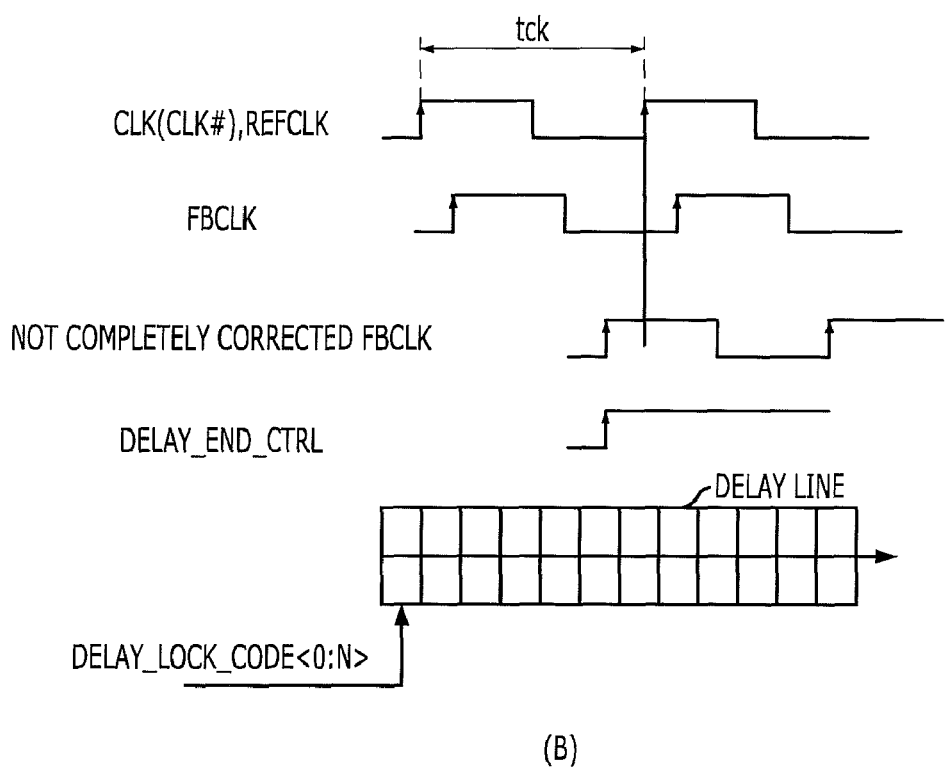

FIG. 7 is a timing diagram for describing a delay locking operation according to the first embodiment of the present invention. As shown, the external clocks CLK and CLK# and the source clock REFCLK may have a high frequency as shown in a diagram (A) and may have a low frequency as shown in a diagram (B). For illustration purposes, phases of the external clocks CLK and CLK# may not be accurately synchronized with a phase of the source clock REFCLK.

As shown in the diagram (A), since the external clocks CLK and CLK# and the source clock REFCLK have comparatively high frequency, one cycle tck of the external clocks CLK and CLK# and the source clock REFCLK s also comparatively short.

Here, a phase difference between a reference edge of the external clocks CLK and CLK# and the source clock REFCLK and a reference edge of a feedback clock FBCLK may not exceed one cycle tck of the external clocks CLK and CLK# and the source clock REFCLK. Therefore, a delay amount of delaying the feedback clock FBCLK may not exceed the one cycle tck of the external clocks CLK and CLK# and the source clock REFCLK in order to synchronize a reference edge of the feedback clock FBCLK with a reference edge of external clocks CLK and CLK# and the source clock REFCLK.

That is, when frequencies of the external clocks CLK and CLK# and the source clock REFCLK are comparatively high, the delay locking operation can terminate even if the feedback clock FBCLK is delayed slightly. Therefore, it is possible to terminate the delay locking operation without using the maximum delay limit of the delay locked loop DLL.

On the contrary, as shown in the timing diagram (B), since frequencies of the external clocks CLK and CLK# and the source clock REFCLK are comparatively low, one cycle tck of the external clocks CLK and CLK# and the source clock REFCLK is comparatively long.

Here, a phase difference of a reference edge of the external clocks CLK and CLK# and the source clock REFCLK and a reference edge of a feedback clock FBCLK may not exceed one cycle tck of the external clocks CLK and CLK# and the source clock REFCLK. In order to synchronize the reference edge of the feedback clock FBCLK with the reference edge of the external clocks CLK and CLK# and the source clock REFCLK, a delay amount of delaying the feedback clock FBCLK may not also exceed one cycle tck of the external clocks CLK and CLK# and the source clock REFCLK.

Therefore, since one cycle tck of the external clocks CLK and CLK# and the source clock REFCLK is comparatively long, a delay amount of delaying the feedback clock FBCLK should be also long in order to synchronize the reference edge of the feedback clock FBCLK with the reference edge of the external clocks CLK and CLK# and the source clock REFCLK.

That is, when the frequencies of the external clocks CLK and CLK# and the source clock REFCLK are comparatively low, the feedback clock FBCLK should be delayed comparatively long to terminate the delay locking operation. Therefore, the delay locking operation may not be terminated even if the delay locked loop (DLL) circuit has reached the delay limit.

As described above, it may be difficult to completely synchronize a reference edge of a feedback clock FBCLK with a reference edge of external clocks CLK and CLK# and a source clock REFCLK when the frequencies of the external clocks CLK and CLK# and the source clock REFCLK are comparatively low. However, the register-controlled delay locked loop (DLL) circuit according to the first embodiment senses such an abnormal state and forcedly terminates the delay locking operation. At this moment, the reference edge of the feedback clock FBCLK is not significantly mismatched with the reference edge of the external clocks CLK and CLK# and the source clock REFCLK even if the delay locking operation is terminated.

The delay locked loop circuit according to the first embodiment may not terminate the delay locking operation even if the delay amount has reached the delay limit. In this state of the delay locked loop circuit according to the first embodiment, frequencies of the external clocks CLK and CLK# and the source clock REFCLK are comparatively low. It means that the frequency of the DQ data outputted from the delay locked loop circuit is also comparatively low. Therefore, it does not cause any serious problems in reading a value of data even if the DQ data has a slight skew.

As described above, the delay locked loop circuit according to the first embodiment forcedly terminates the delay locking operation when the delay end signal DELAY_END_CTRL is activated to logic high. That is, the delay locking operation is forcedly terminated when the external clocks CLK and CLK# and the source clock REFCLK have a comparatively low frequency. In this state of the delay locked loop (DLL) circuit according to the first embodiment, one cycle tck of the external clocks CLK and CLK# and the source clock REFCLK becomes comparatively long. Therefore, a phase difference between the source clock REFCLK and the feedback clock FBCLK after a delay amount has reached the delay limit is comparatively short compared to one cycle of the external clock CLK and CLK# and the source clock REFCLK. This short phase difference does not influence reading the value of the DQ data outputted by the operation of the delay locked look (DLL) circuit.

Figure 3:
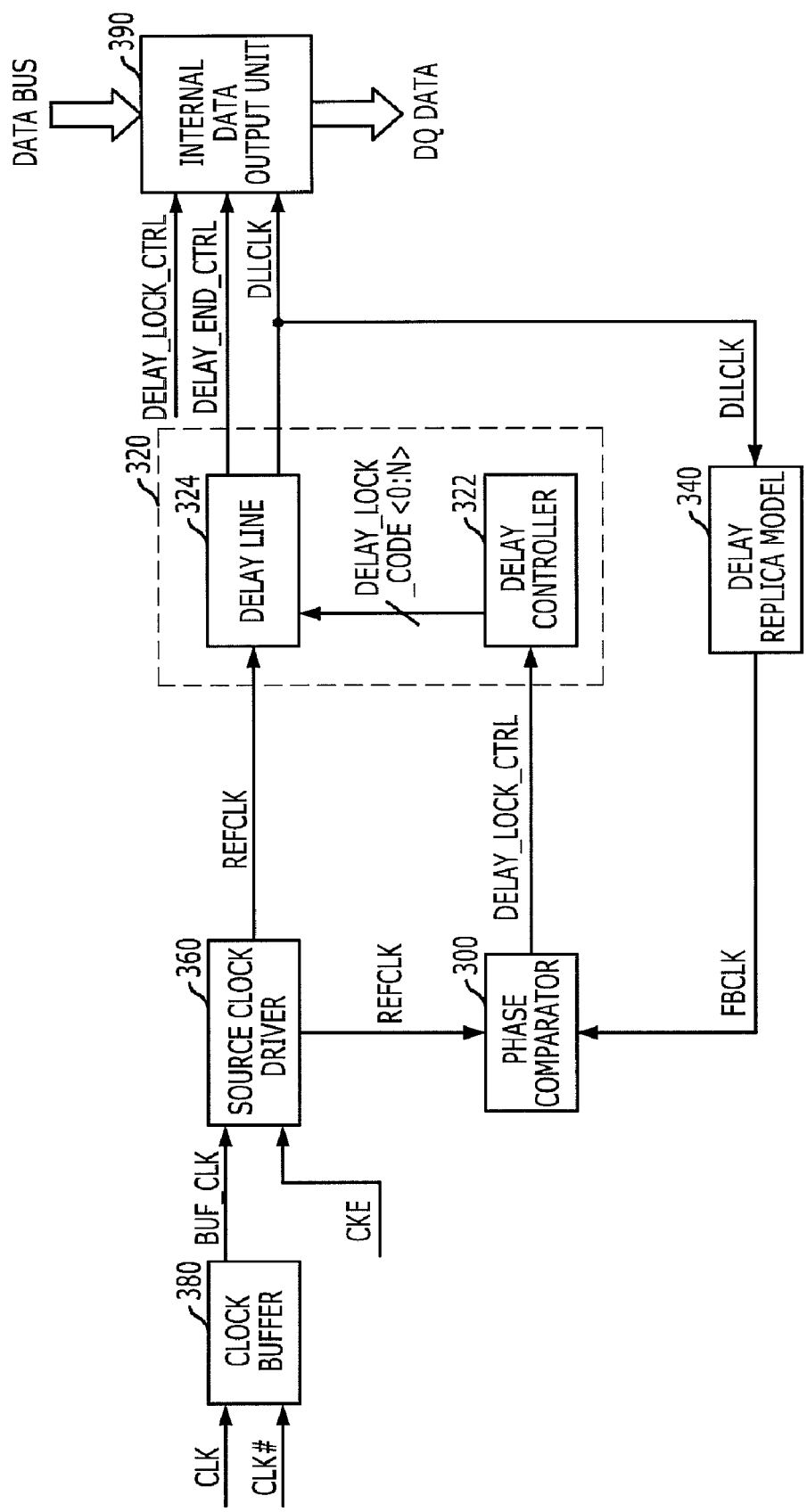
FIG. 3 is a block diagram illustrating a register-controlled delay locked loop (DLL) circuit in accordance with a second embodiment of the present invention.

FIG. 3 is a block diagram illustrating a register-controlled delay locked loop (DLL) according to a second embodiment of the present invention.

Referring to FIG. 3, the register-controlled delay locked loop (DLL) according to the second embodiment includes a clock buffer 380, a source clock driver 360, a phase comparator 300, a clock delay 320, a delay replica model 340, and an internal data output unit 390.

The clock buffer 380 buffers a clock supplied from an external device. The source clock driver 360 drives an output clock BUF_CLK of the clock buffer 380 in response to a clock enable signal CKE to output as a source clock REFCLK. The phase comparator 300 compares a phase of a source clock REFCLK with a phase of a feedback clock FBCLK and generates a delay locking signal DELAY_LOCK_CTRL based on the comparison result. The clock delay 320 delays the source clock REFCLK in response to the delay locking signal DELAY_LOCK_CTRL and outputs the delayed source clock as a delay locked clock DLLCLK and generates a delay end signal DELAY_END_CTRL in response to reaching a delay limit. The delay replica model 340 outputs a feedback clock FBCLK by reflecting a delay time of an output path of the source clock REFCLK at the delay locked clock DLLCLK. The internal data output unit 390 synchronizes internal data DATA BUS to a delay locked clock DLLCLK and outputs the synchronized internal data as an external output DQ_DATA. Also, the operation of the internal data output unit 390 is turned On/Off in response to the delay locking signal DELAY_LOCK_CTRL.

More specifically, the clock buffer 380 generates an internal clock BUF_CLK by buffering clocks CLK and CLK# from an external device.

The source clock driver 360 outputs a buffered clock BUF_CLK as a source clock REFCLK during an activation period of a clock enable signal CKE. The source clock driver 360 does not output the buffered clock BUF_CLK as a source clock REFCLK during an inactivation period of a clock enable signal CKE. That is, the source clock REFCLK toggles identically to the buffered clock BUF_CLK during the activation period of the clock enable signal CKE. On the contrary, the source clock REFCLK do not toggle, irrespective of the buffered clock BUF_CLK, during the inactivation period of the clock enable signal CKE.

For illustration purposes, a clock enable signal CKE may always sustain an activation state in a normal operation of a semiconductor memory device. However, the clock enable signal CKE may be inactivated in a specific operation mode such as a power down mode for reducing power consumption of a semiconductor memory device.

The phase comparator 300 activates a delay locking signal DELAY_LOCK_CTRL to logic high and outputs the activated delay locking signal DELAY_LOCK_CTRL when a reference edge of a feedback clock FBCLK is behind/trails a reference edge of a source clock REFCLK at an update time, which is repeated at a predetermined interval while performing a delay locking operation. Here, the reference edge of the source clock REFCK is a rising edge in general. However, it is not limited thereto. The reference edge of the source clock REFCK may be a falling edge. Also, the phase comparator 300 inactivates the delay locking signal DELAY_LOCK_CTRL to logic low and outputs the inactivated delay locking signal DELAY_LOCK_CTRL when a reference edge of feedback clock FBCLK is ahead of/leads a reference edge of the source clock REFCLK at an update time, which is repeated at a predetermined interval while a delay locking operation is performed.

When a delay end signal DELAY_END_CTRL outputted from a delay line 320 of the clock delay 320 is inactivated to logic low, the internal data output unit 390 performs following operations. The internal data output unit 390 is turned off and does not output internal data DATA_BUS while a delay locking operation is performed corresponding a delay locking signal DELAY_LOCK_CTRL. On the contrary, the internal data output unit 390 is turned on and outputs internal data DATA_BUS as output data DQ_DATA while the delay locking operation is not performed corresponding to the delay locking signal DELAY_LOCK.

That is, the internal data output unit 390 is turned off and does not output internal data DATA BUS if the delay locking signal DELAY_LOCK_CTRL is not changed and fixed to one of logic high and logic low while the update time is repeated as many as predetermined times during the performance of the delay locking operation. The internal data output unit 390 is turned on and outputs internal data DATA BUS as output data DQ DATA if the delay locking signal is changed between an activation state logic high and an inactivation state logic low while the update time is repeated as many as the predetermined times during the performance of the delay locking operation.

Also, when a delay end signal DELAY_END_CTRL outputted from the delay line 320 of the clock delay unit 320 is activated to logic high, the internal data output unit 390 is turned on and outputs internal data DAT BUS as output data DQ DATA regardless of whether the delay locking operation is performed or not in response to the delay locking signal DELAY_LOCK_CTRL.

As described above, the internal data output unit 390 is turned off and does not output internal data DATA BUS as output data DQ DATA while performing the delay locking operation and the internal data output unit 390 is turned on and outputs internal data DATA BUS as output data DQ DATA after the delay locking operation terminates. The internal data output unit 390 performs these operations because of following reason. If the internal data output unit 390 synchronizes with and outputs the internal data DATA BUS in sync with the delay locked clock DLLCLK when external clocks CLK and CLK# are not accurately synchronized with the delay locked clock DLLCLK due to the delay locking operation being still performed, it is difficult to read the outputted data. Likely, this outputted data may not be used. The internal data output unit 390 prevents power from being wasted in outputting data with an inaccurate value while performing the above described operations.

As described above, the internal data DATA BUS is outputted only after the delay locking operation completely terminates. Therefore, the clock delay unit 320 may not completely terminate the delay locking operation and the internal data DATA BUS may not be outputted as the output data DQ DATA because the clock delay unit 320 does not completely terminate the delay locking operation.

The clock delay unit 320 includes a delay controller 322 and a delay line 324. The delay controller 322 changes a value of a delay locking code DELAY_LOCK_CODE<0:N> formed of a plurality of bits in response to a delay locking signal DELAY_LOCK_CTRL. The delay line 324 delays a source clock REFCLK by as much as a delay amount corresponding to the delay locking code DELAY_LOCK_CODE<0:N>. The delay line 324 activates a delay end signal DELAY_END_CTRL when the value of the delay locking code DELAY_LOCK_CODE<0:N> is greater than a value of delay limit.

The delay controller 322 changes a value of delay locking code DELAY_LOCK_CODE<0:N> in response to a delay locking signal DELAY_LOCK_CTRL at a update time, which is repeated at a predetermined interval in during the performance of the delay locking operation. The delay controller 322 does not change the value of delay locking code DELAY_LOCK_CODE<0:N>, regardless of the update time and regardless of a value of the delay locking signal DELAY_LOCK_CTRL, after the delay locking operation terminates.

That is, while the delay locking operation is performed, the delay controller 322 increases the value of delay locking code DELAY_LOCK_CODE<0:N> when the delay locking signal DELAY_LOCK_CTROL is activated to logic high at every update time, which is repeated at a predetermined interval. Also, the delay controller 322 decreases the value of delay locking code DELAY_LOCK_CODE<0:N> when the delay locking signal DELAY_LOCK_CTRL is inactivated to logic low at every update time, which is repeated at a predetermined interval.

The delay line 324 delays a source clock REFCLK by as much as a delay amount corresponding to a value of the delay locking code DELAY_LOCK_CODE<0:N> and outputs the delayed source clock REFCLK as a delay locked clock DLLCLK. Here, the delay amount corresponding to the value of delay locking code DELAY_LOCK_CODE<0:N> should be set to a comparative value.

For example, it is assumed that the delay locking code DELAY_LOCK_CODE<0:N> is a four-bit signal. Under this assumption, if the value of the delay locking code DELAY_LOCK_CODE<0:N> is '0 0 0 0', the delay line 324 may be set to not delay the source clock REFCLK and output the source clock REFCLK as a delay locked clock DLLCLK. The delay line 324 may be set to delay the source clock REFCLK longer and output the delayed source clock REFCLK as the delay locked clock DLLCLK as the value of the delay locking code DELAY_LOCK_CODE<0:N> increases for example from '0 0 0 1', '0 0 1 0', '0 0 1 1', '0 1 0 0', ..., to '1 1 1 1'. Here, the delay locking code DELAY_LOCK_CODE<0:N> may have a predetermined initial value at a beginning of the delay locking operation. In general, the initial value may be set as a middle value such as '0 1 1 0' rather than the smallest value '0 0 0 0'.

Even if it is not shown in the drawing, the delay line 324 may include a plurality of unit delays. In this case, the delay line 324 may be set to delay the source clock REFCLK longer and output the delayed source clock REFCLK as the delay locked clock DLLCLK as the value of the delay locking code DELAY_LOCK_CODE<0:N> increases. On the contrary, the delay line 324 may be set to delay the source clock REFCLK less by using less number of the unit delays and output the delayed source clock REFCLK as the delay locked clock DLLCLK as the value of the delay locking code DELAY_LOCK_CODE<0:N> decreases.

The number of the unit delays in the delay line 324 may be set according to design needs. The number of the unit delay may not be changed after being set up during the initial design. Also, the size of the delay line 324 increases in proportion to the number of unit delays. Therefore, it is inefficient to increase the number of unit delays without limitation.

Therefore, it is desirable to set a delay limit. The limit delay limits a delay amount of the delay line 324 to delay the source clock REFCLK. If a phase of a source clock REFLCK is not synchronized with a phase of a feedback clock FBCLK after a delay amount has reached the delay limit as in the related art, a value of the delay locking code DELAY_LOCK_CODE<0:N> may increase continually. In this case, a delay locking operation will never terminate.

If the delay locking operation is not terminated as described above, the internal data output unit 390 may not output the internal data DATA BUS as output data DQ DATA. Therefore, a semiconductor memory device may not perform a read operation.

In order to overcome such a problem, the delay line 324 according to the second embodiment activates the delay end signal DELAY_END_CTRL to logic high and outputs the activated delay end signal DELAY_END_CTRL if a delay amount has reached the delay limit.

At the same time, the internal data output unit 390 outputs the internal data DATA BUS as output data DQ DATA when the delay end signal DEALY_END_CTRL is activated to logic high. Therefore, the internal data output unit 390 performs related operation regardless of whether the delay locking operation is performed or not.

As described above, the register-controlled delay locked loop DLL according to the second embodiment can output internal data DATA BUS outputted from a core region of a semiconductor memory device as the output data DQ DATA when the register-controlled delay locked loop senses that a phase difference between the source clock REFCK and the outputted delay locked clock DLLCLK has reached a maximum value. In the foregoing manner, the resister controlled delay locked loop DLL according to the second embodiment can improve the reliability thereof.

In the second embodiment, when the delay amount of the delay line 324 has reached the delay limit, the delay end signal DELAY_END_CTRL is activated to logic high. In this case, the phase of the source clock REFCLK is not synchronized with the phase of the feedback clock FBCLK even if the internal data output 390 outputs the internal data DATA BUS to the outside as the output data DQ DATA. Therefore, a phase of DQ data outputted from an internal data output unit 390 is not accurately synchronized with external clocks CLK and CLK#. Even if the phase of DQ data is not synchronized with the external clocks CLK and CLK#, the register-controlled delay locked look according to the second embodiment can still effectively perform the delay locking operation. It will be described in detail with reference to FIG. 7.

FIG. 7 is a timing diagram for describing a delay locking operation according to embodiments of the present invention. As shown, the external clocks CLK and CLK# and the source clock REFCLK may have a high frequency as shown in a diagram (A) and may have a low frequency as shown in a diagram (B). For illustration purposes, phases of the external clocks CLK and CLK# may not be accurately synchronized with a phase of the source clock REFCLK.

As shown in the diagram (A), since the external clocks CLK and CLK# and the source clock REFCLK have comparatively high frequency, one cycle tck of the external clocks CLK and CLK# and the source clock REFCLK is also comparatively short.

Here, a phase difference between a reference edge of the external clocks CLK and CLK# and the source clock REFCLK and a reference edge of a feedback clock FBCLK may not exceed one cycle tck of the external clocks CLK and CLK# and the source clock REFCLK. Therefore, a delay amount of delaying the feedback clock FBCLK may not exceed the one cycle tck of the external clocks CLK and CLK# and the source clock REFCLK in order to synchronize a reference edge of the feedback clock FBCLK with a reference edge of external clocks CLK and CLK# and the source clock REFCLK.

That is, when frequencies of the external clocks CLK and CLK# and the source clock REFCLK are comparatively high, the delay locking operation can terminate even if the feedback clock FBCLK is delayed slightly. Therefore, it is possible to terminate the delay locking operation without reaching the maximum delay limit of the delay locked loop DLL. On the contrary, as shown in the timing diagram (B), since frequencies of the external clocks CLK and CLK# and the source clock REFCLK are comparatively low, one cycle tck of the external clocks CLK and CLK# and the source clock REFCLK is comparatively long. Here, a phase difference of a reference edge of the external clocks CLK and CLK# and the source clock REFCLK and a reference edge of a feedback clock FBCLK may not exceed one cycle tck of the external clocks CLK and CLK# and the source clock REFCLK. In order to synchronize the reference edge of the feedback clock FBCLK with the reference edge of the external clocks CLK and CLK# and the source clock REFCLK, a delay amount of delaying the feedback clock FBCLK may not also exceed one cycle tck of the external clocks CLK and CLK# and the source clock REFCLK.

Therefore, since one cycle tck of the external clocks CLK and CLK# and the source clock REFCLK is comparatively long, a delay amount of delaying the feedback clock FBCLK should also be comparatively long in order to synchronize the reference edge of the feedback clock FBCLK with the reference edge of the external clocks CLK and CLK# and the source clock REFCLK.

That is, when the frequencies of the external clocks CLK and CLK# and the source clock REFCLK are comparatively low, the feedback clock FBCLK should be delayed comparatively long to terminate the delay locking operation. Therefore, the delay locking operation may not be terminated even if the delay locked loop (DLL) circuit has reached the delay limit.

As described above, it may be difficult to completely synchronize a reference edge of a feedback clock FBCLK with a reference edge of external clocks CLK and CLK# and a source clock REFCLK when the frequencies of the external clocks CLK and CLK# and the source clock REFCLK are comparatively low. However, the register-controlled delay locked loop (DLL) circuit according to the second embodiment senses such an abnormal state and forcedly terminates the delay locking operation. At this moment, the reference edge of the feedback clock FBCLK is not significantly mismatched with the reference edge of the external clocks CLK and CLK# and the source clock REFCLK even if the delay locking operation is terminated.

The delay locked loop circuit according to the second embodiment may not terminate the delay locking operation even if the delay amount has reached the delay limit. In this state of the delay locked loop circuit according to the second embodiment, frequencies of the external clocks CLK and CLK# and the source clock REFCLK are comparatively low. It means that the frequency of the DQ data outputted from the delay locked loop circuit is also comparatively low. Therefore, it does not cause any serious problems in reading a value of data even if the DQ data has a slight skew.

As described above, the delay locked loop circuit according to the second embodiment outputs the internal data DATA BUS as the output data DQ DATA when the delay end signal DELAY_END_CTRL is activated to logic high. That is, the delay locking operation is forcedly terminated when the external clocks CLK and CLK# and the source clock REFCLK have a comparatively low frequency. In this state of the delay locked loop (DLL) circuit according to the second embodiment, one cycle tck of the external clocks CLK and CLK# and the source clock REFCLK becomes comparatively long. Therefore, a phase difference between the source clock REFCLK and the feedback clock FBCLK after a delay amount has reached the delay limit is comparatively short compared to one cycle of the external clock CLK and CLK# and the source clock REFCLK. This short phase difference does not effect reading the value of the DQ data outputted by the operation of the delay locked look (DLL) circuit.

Figure 4:
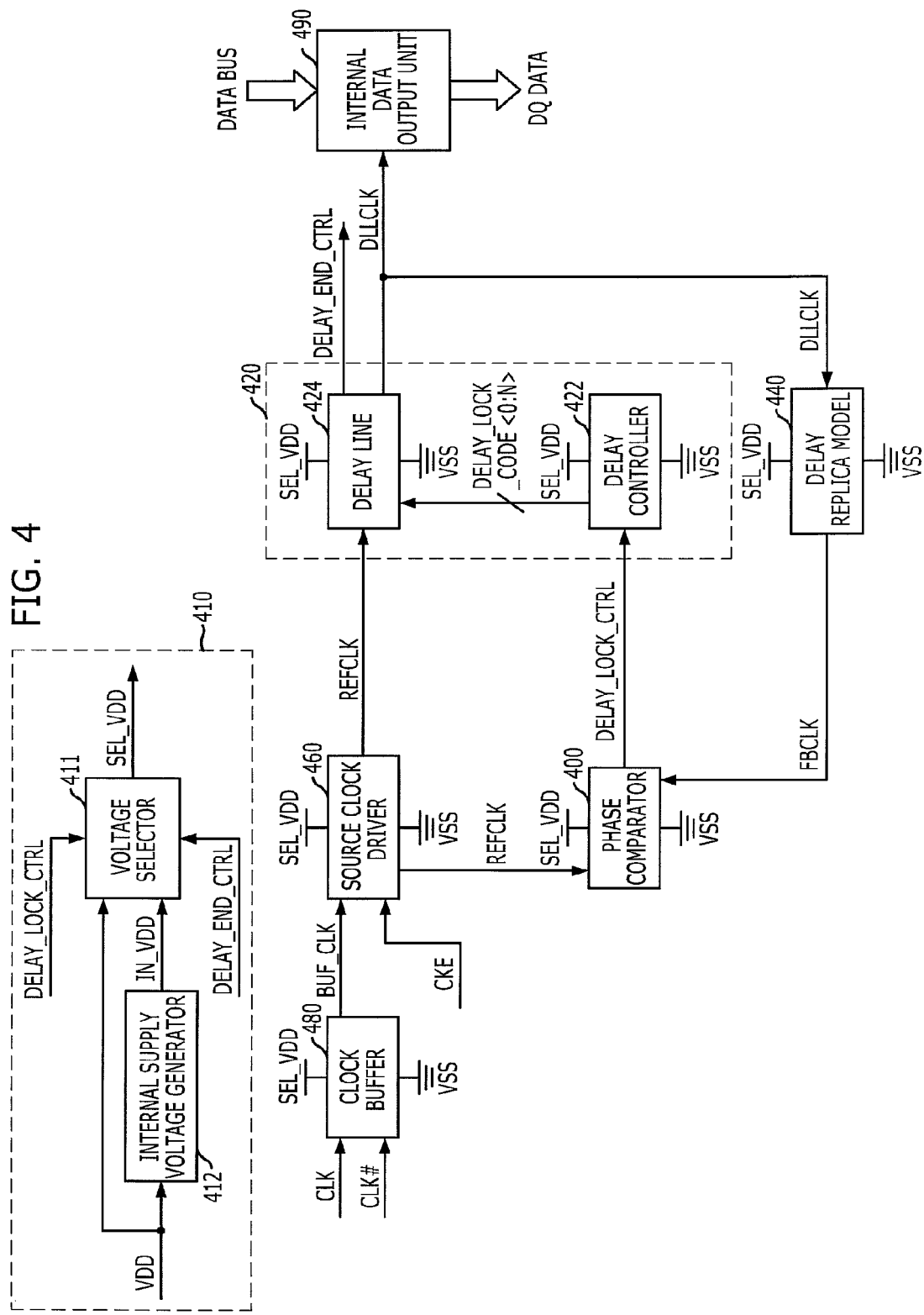
FIG. 4 is a block diagram illustrating a register-controlled delay locked loop (DLL) circuit in accordance with a third embodiment of the present invention.

FIG. 4 is a block diagram illustrating a register-controlled delay locked loop (DLL) according to a third embodiment of the present invention.

Referring to FIG. 2, the register-controlled delay locked loop (DLL) according to the third embodiment includes a supply voltage selector 410, a clock buffer 480, a source clock driver 460, a phase comparator 400, a clock delay 420, and a delay replica model 440.

The supply voltage selector 410 selectively supplies one of an external supply voltage VDD or an internal supply voltage IN_VDD as a selected supply voltage SEL_VDD in response to a delay locking signal DELAY_LOCK_CTRL and a delay end signal DELAY_END_CTRL. Here, the internal supply voltage IN_VDD has a voltage level lower than the external supply voltage VDD. The clock buffer 480 uses the selected supply voltage SEL_VDD from the supply voltage selector 410 and buffers a clock supplied from an external device. The source clock driver 460 uses the selected supply voltage SEL_VDD from the supply voltage selector 410 and drives an output clock BUF_CLK of the clock buffer 480 in response to a clock enable signal CKE to output as a source clock REFCLK. The phase comparator 400 uses the selected supply voltage SEL_VDD from the supply voltage selector 410 and compares a phase of a source clock REFCLK with a phase of a feedback clock FBCLK and generates a delay locking signal DELAY_LOCK_CTRL based on the comparison result. The clock delay 420 uses the selected supply voltage SEL_VDD from the supply voltage selector 410 and delays the source clock REFCLK in response to the delay locking signal DELAY_LOCK_CTRL and outputs the delayed source clock as a delay locked clock DLLCLK and generates a delay end signal DELAY_END_CTRL when a delay amount has reached a delay limit. The delay replica model 440 outputs a feedback clock FBCLK by reflecting a delay time of an output path of the source clock REFCLK at the delay locked clock DLLCLK.

More specifically, the supply voltage selector 410 includes an internal supply voltage generator 412 and a voltage selecting unit 414. The internal supply voltage generator 412 generates an internal supply voltage IN_VDD having a voltage level lower than a voltage level of an external supply voltage VDD by dividing the voltage level of the external supply voltage VDD by a predetermined ratio. The voltage selecting unit 414 selects one of the internal supply voltage IN_VDD and the external supply voltage VDD in response to the delay locking signal DELAY_LOCK_CTRL and the delay end signal DELAY_END_CTRL and output the selected supply voltage SEL_VDD.

Also, the supply voltage elector 410 outputs the external supply voltage VDD as the selected supply voltage SEL_VDD in response to performance of a delay locking operation corresponding to a delay locking signal when the delay end signal DELAY_END_CTRL outputted from the delay line 420 of the clock delay 420 and outputs the internal supply voltage IN_VDD as the selected supply voltage SEL_VDD in response to non-performance of the delay locking operation corresponding to the delay locking signal DELAY_LOCK_CTRL.

That is, the supply voltage selector 410 outputs the external supply voltage VDD as the selected supply voltage SEL_VDD when the delay locking signal DELAY_LOCK_CTRL is not changed and fixed to one of logic high and logic low while an update time is repeated as many as predetermined times. Also, the supply voltage selector 410 outputs the internal supply voltage IN_VDD as the selected supply voltage SEL_VDD when the delay locking signal DELAY_LOCK_CTRL is repeatedly changed between an activation state of logic high and an inactivation state of logic low while an update time is repeated as many as predetermined times during the performance of the delay locking operation.

Further, the supply voltage selector 410 outputs the internal supply voltage IN_VDD as the selected supply voltage SEL_VDD regardless of whether the delay locking operation is performed or not corresponding to the delay locking signal DELAY_LOCKU_CTRL when the delay end signal DELAY_END_CTRL outputted from the delay line 420 of the clock delay 420 is activated to logic high.

The clock buffer 480 uses the selected supply voltage SEL_VDD from the supply voltage selector 410 and generates an internal clock BUF_CLK by buffering clocks CLK and CLK# from an external device.

Here, the selected supply voltage SEL_VDD supplied to the clock buffer 480 is one of an external supply voltage VDD supplied from an external device and an internal supply voltage generated by the internal voltage generator 412 of the supply voltage elector 410. The clock buffer 480 performs the same operation regardless of whether the external supply voltage VDD or the internal supply voltage IN_VDD is supplied. However, since the voltage level of the external supply voltage VDD is higher than that of the internal supply voltage IN_VDD, the clock buffer 480 outputs a buffered clock BUF_CLK having a narrower voltage swing when the internal supply voltage IN_VDD is supplied to the clock buffer 480 than a voltage swing when the external supply voltage VDD is supplied to the clock buffer 480. That is, the clock buffer 480 consumes less power when the internal supply voltage IN_VDD is supplied to the clock buffer 480 compared to when the external supply voltage VDD is supplied to the clock buffer 480.

The source clock driver 460 uses the selected supply voltage SEL_VDD from the supply voltage selector 410 and outputs a buffered clock BUF_CLK as a source clock REFCLK during an activation period of a clock enable signal CKE. The source clock driver 460 does not output the buffered clock BUF_CLK as a source clock REFCLK during an inactivation period of a clock enable signal CKE. That is, the source clock REFCLK toggles identically to the buffered clock BUF_CLK during the activation period of the clock enable signal CKE. On the contrary, the source clock REFCLK do not toggle, irrespective of the buffered clock BUF_CLK, during the inactivation period of the clock enable signal CKE.

Here, the selected supply voltage SEL_VDD supplied to the source clock driver 460 is one of an external supply voltage VDD supplied from an external device and an internal supply voltage generated by the internal voltage generator 412 of the supply voltage elector 410. The source clock driver 460 performs the same operation regardless of whether the external supply voltage VDD or the internal supply voltage IN_VDD is supplied. However, since the voltage level of the external supply voltage VDD is higher than that of the internal supply voltage IN_VDD, the source clock driver 460 outputs a source clock REFCLK having a narrower voltage swing when the internal supply voltage IN_VDD is supplied to the source clock driver 460 than a voltage swing when the external supply voltage VDD is supplied to the source clock driver 460. That is, the source clock driver 460 consumes less power when the internal supply voltage IN_VDD is supplied to the source clock driver 460 compared to when the external supply voltage VDD is supplied to the source clock driver 460.

For illustration purposes, a clock enable signal CKE may always sustain an activation state in a normal operation of a semiconductor memory device. However, the clock enable signal CKE may be inactivated in a specific operation mode such as a power down mode for reducing power consumption of a semiconductor memory device.

The phase comparator 400 uses the selected supply voltage SEL_VDD from the supply voltage selector 410 and activates a delay locking signal DELAY_LOCK_CTRL to logic high and outputs the activated delay locking signal DELAY_LOCK_CTRL when a reference edge of a feedback clock FBCLK is behind a reference edge of a source clock REFCLK at an update time, which is repeated at a predetermined interval while performing a delay locking operation. Here, the reference edge of the source clock REFCK is a rising edge in general. However, it is not limited thereto. The reference edge of the source clock REFCK may be a falling edge. Also, the phase comparator 400 inactivates the delay locking signal DELAY_LOCK_CTRL to logic low and outputs the inactivated delay locking signal DELAY_LOCK_CTRL when a reference edge of feedback clock FBCLK is ahead of a reference edge of the source clock REFCLK at an update time, which is repeated at a predetermined interval while a delay locking operation is performed.

Here, the selected supply voltage SEL_VDD supplied to the source clock driver 460 is one of an external supply voltage VDD supplied from an external device and an internal supply voltage generated by the internal voltage generator 412 of the supply voltage elector 410. The phase comparator 400 performs the same operation regardless of whether the external supply voltage VDD or the internal supply voltage IN_VDD is supplied. However, since the voltage level of the external supply voltage VDD is higher than that of the internal supply voltage IN_VDD, the phase comparator 400 compares the phase difference between the source clock REFCLK and the feedback clock FBCLK in a comparative high speed and outputs a delay locking signal DELAY_LOCK_CTRL having a comparatively wider voltage swing when the external supply voltage VDD is supplied to the phase comparator 400. On the contrary, the phase comparator 400 compares the phase difference between the source clock REFCLK and the feedback clock FBCLK in a comparatively low speed and outputs a delay locking signal DELAY_LOCK_CTRL having a comparatively narrower voltage swing when the internal supply voltage IN_VDD is supplied to the phase comparator 400. That is, the phase comparator 400 consumes less power when the internal supply voltage IN_VDD is supplied to the phase comparator 400 compared to when the external supply voltage VDD is supplied to the phase comparator 400.

The clock delay 420 uses the selected supply voltage SEL_VDD from the supply voltage selector 410. The clock delay 420 includes a delay controller 422 and a delay line 424. The delay controller 422 changes a value of delay locking code DELAY_LOCK_CODE<0:N> formed of a plurality of bits in response to a delay locking signal DELAY_LOCK_CTRL. The delay line 424 delays a source clock REFCLK by as much as a delay amount corresponding to the value of the delay locking code DELAY_LOCK_CODE<0:N>. Here, when the value of delay locking code DELAY_LOCK_CODE<0:N> is larger than a value of a delay limit, the delay line 424 activates the delay end signal DELAY_END_CTRL.

The delay controller 422 uses the selected supply voltage SEL_VDD from the supply voltage selector 410 and changes a value of delay locking code DELAY_LOCK_CODE<0:N> in response to a delay locking signal DELAY_LOCK_CTRL at a update time, which is repeated at a predetermined interval during the performance of the delay locking operation. The delay controller 422 does not change the value of delay locking code DELAY_LOCK_CODE<0:N> regardless of the update time and regardless of a value of the delay locking signal DELAY_LOCK_CTRL.

That is, the delay controller 422 uses the selected supply voltage SEL_VDD from the supply voltage selector 410 and increases the value of delay locking code DELAY_LOCK_CODE<0:N> when the delay locking signal DELAY_LOCK_CTROL is activated to logic high at every update time, which is repeated at a predetermined interval. Also, the delay controller 422 decreases the value of delay locking code DELAY_LOCK_CODE<0:N> when the delay locking signal DELAY_LOCK_CTRL is inactivated to logic low at every update time, which is repeated at a predetermined interval by using the selected supply voltage SEL_VDD from the supply voltage selector 410.

Here, the selected supply voltage SEL_VDD supplied to the source clock driver 460 is one of an external supply voltage VDD supplied from an external device and an internal supply voltage generated by the internal voltage generator 412 of the supply voltage elector 410. The delay controller 422 performs the same operation regardless of whether the external supply voltage VDD or the internal supply voltage IN_VDD is supplied. However, since the voltage level of the external supply voltage VDD is higher than that of the internal supply voltage IN_VDD, the delay controller 422 changes the value of the delay locking code DELAY_LOCK_CODE<0N> in response to the delay locking signal DELAY_LOCK_CTRL at a comparatively fast speed when the external supply voltage VDD is supplied to the delay controller 422. On the contrary, the delay controller 422 changes the value of the delay locking code DELAY_LOCK_CODE<0N> in response to the delay locking signal DELAY_LOCK_CTRL at a comparatively slow speed when the internal supply voltage IN_VDD is supplied to the delay controller 422. That is, the delay controller 422 consumes less power when the internal supply voltage IN_VDD is supplied to the delay controller 422 compared to when the external supply voltage VDD is supplied to the delay controller 422.

The delay line 424 uses the selected supply voltage SEL_VDD from the supply voltage selector 410, delays a source clock REFCLK by as much as a delay amount corresponding to a value of the delay locking code DELAY_LOCK_CODE<0:N>, and outputs the delayed source clock REFCLK as a delay locked clock DLLCLK.

Here, the selected supply voltage SEL_VDD supplied to the source clock driver 460 is one of an external supply voltage VDD supplied from an external device and an internal supply voltage generated by the internal voltage generator 412 of the supply voltage elector 410. The delay line 424 has an internal circuit that delays a source clock REFCLK by as much as a delay amount corresponding to a value of a delay locking code DELAY_LOCK_CODE<0:N> and outputs the delay locked clock DLLCLK regardless of whether the internal supply voltage IN_VDD or the external supply voltage VDD is supplied as the selected supply voltage SEL_VDD. Here, the delay amount corresponding to the value of delay locking code DELAY_LOCK_CODE<0:N> should be set to a comparative value.

For example, it is assumed that the delay locking code DELAY_LOCK_CODE<0:N> is a four-bit signal. Under this assumption, if the value of the delay locking code DELAY_LOCK_CODE<0:N> is '0 0 0 0', the delay line 424 may be set to not delay the source clock REFCLK and output the source clock REFCLK as a delay locked clock DLLCLK. The delay line 424 may be set to delay the source clock REFCLK longer and output the delayed source clock REFCLK as the delay locked clock DLLCLK as the value of the delay locking code DELAY_LOCK_CODE<0:N> increases for example from '0 0 0 1', '0 0 1 0', '0 0 1 1', '0 1 0 0', . . . , to '1 1 1 1'. Here, the delay locking code DELAY_LOCK_CODE<0:N> may have a predetermined initial value at a beginning of the delay locking operation. In general, the initial value may be set as a middle value such as '0 1 1 0' rather than the smallest value '0 0 0 0'.

Even if it is not shown in the drawing, the delay line 424 may include a plurality of unit delays. In this case, the delay line 424 may be set to delay the source clock REFCLK longer and output the delayed source clock REFCLK as the delay locked clock DLLCLK as the value of the delay locking code DELAY_LOCK_CODE<0:N> increases. On the contrary, the delay line 424 may be set to delay the source clock REFCLK less by using less number of the unit delays and output the delayed source clock REFCLK as the delay locked clock DLLCLK as the value of the delay locking code DELAY_LOCK_CODE<0:N> decreases. Here, each of the unit delays is designed to have the same delay amount regardless of whether the selected supply voltage SEL_VDD is the external supply voltage VDD or the internal supply voltage IN_VDD.

As described above, if the external supply voltage VDD having a comparatively high voltage level is supplied to components of the delay locked loop (DLL) circuit as power source, the components consume a comparatively large amount of current even if the components may perform better. On the contrary, if the internal supply voltage IN_VDD having a comparatively low voltage level is supplied to components of the delay locked loop (DLL) circuit as power source, the components consume a comparatively less amount of current even if the performance of the components may be slightly degraded.

Therefore, in order to minimize the power consumption of the delay locked loop (DLL) circuit, it is desirable to control the delay locking operation to terminate within a shortest time. Therefore, under a following situation, the clock delay 420 may not completely terminate the delay locking operation. As a result, the delay locking operation may become infinite loop or the delay locking operation takes a comparatively long time to terminate even if the delay locking operation is terminated. As a result, the power consumption of the delay locking operation becomes significantly increased.

The number of the unit delays in the delay line 424 may be set according to design needs. The number of the unit delay may not be changed after being set up during the initial design. Also, the size of the delay line 424 increases in proportion to the number of unit delays. Therefore, it is inefficient to increase the number of unit delays without limitation.

Therefore, it is desirable to set a delay limit. The limit delay limits a delay amount of the delay line 424 to delay the source clock REFCLK. If a phase of a source clock REFLCK is not synchronized with a phase of a feedback clock FBCLK after a delay amount has reached the delay limit like the related art, a value of the delay locking code DELAY_LOCK_CODE<0:N> may increase continually. In this case, a delay locking operation will never terminate.

In order to overcome such a problem of the related art, the delay line 424 according to the third embodiment activates the delay end signal DELAY_END_CTRL to logic high and outputs the activated delay end signal DELAY_END_CTRL if a delay amount has reached the delay limit.

At the same time, the delay locking operation controller 250 activate a signal DELAY_LOCK_END to logic high and outputs the activated signal DELAY_LOCK_END in response to the activation of the delay end signal DELAY_END_CTRL and the delay controller 422 locks the value of delay locking code DELAY_LOCK_CODE<0:N> in response to the activation of the signal DELAY_END_CTRL outputted from the delay locking operation controller 250. As a result, the delay locking operation is forcedly terminated.

As described above, the register-controlled delay locked loop DLL according to the third embodiment can control a voltage level of a supply voltage supplied to the delay locked loop circuit. Therefore, the resister controlled delay locked loop DLL according to the third embodiment can sustain power consumption of the delay locking operation minimum.

When the delay amount of the delay line 424 has reached the delay limit, the delay locking operation is terminated by activating the delay end signal DELAY_END_CTRL to logic high. In this case, the phase of the source clock REFCLK is not accurately synchronized with the phase of the feedback clock FBCLK even if the supply voltage supplied to the delay locked loop DLL circuit is chanted from the external supply voltage VDD to the internal supply voltage IN_VDD by the supply voltage selector 410. Therefore, a phase of DQ data outputted from an internal data output unit 490 may not be accurately synchronized with external clocks CLK and CLK#. That is, the delay locking operation may not completely end. Even if the phase of DQ data is not accurately synchronized with the external clocks CLK and CLK#, the register-controlled delay locked loop according to the third embodiment can still effectively perform the delay locking operation. It will be described in detail with reference to FIG. 7.

FIG. 7 is a timing diagram for describing a delay locking operation according to the third embodiment of the present invention. As shown, the external clocks CLK and CLK# and the source clock REFCLK may have a high frequency as shown in a diagram (A) and may have a low frequency as shown in a diagram (B). For illustration purposes, phases of the external clocks CLK and CLK# may not be accurately synchronized with a phase of the source clock REFCLK.

As shown in the diagram (A), since the external clocks CLK and CLK# and the source clock REFCLK have comparatively high frequency, one cycle tck of the external clocks CLK and CLK# and the source clock REFCLK is also comparatively short.

Here, a phase difference between a reference edge of the external clocks CLK and CLK# and the source clock REFCLK and a reference edge of a feedback clock FBCLK may not exceed one cycle tck of the external clocks CLK and CLK# and the source clock REFCLK. Therefore, a delay amount of delaying the feedback clock FBCLK may not exceed the one cycle tck of the external clocks CLK and CLK# and the source clock REFCLK in order to synchronize a reference edge of the feedback clock FBCLK with a reference edge of external clocks CLK and CLK# and the source clock REFCLK.

That is, when frequencies of the external clocks CLK and CLK# and the source clock REFCLK are comparatively high, the delay locking operation can terminate even if the feedback clock FBCLK is delayed slightly. Therefore, it is possible to terminate the delay locking operation without using the maximum delay limit of the delay locked loop DLL.

On the contrary, as shown in the timing diagram (B), since frequencies of the external clocks CLK and CLK# and the source clock REFCLK are comparatively low, one cycle tck of the external clocks CLK and CLK# and the source clock REFCLK is comparatively long.

Here, a phase difference of a reference edge of the external clocks CLK and CLK# and the source clock REFCLK and a reference edge of a feedback clock FBCLK may not exceed one cycle tck of the external clocks CLK and CLK# and the source clock REFCLK. In order to synchronize the reference edge of the feedback clock FBCLK with the reference edge of the external clocks CLK and CLK# and the source clock REFCLK, a delay amount of delaying the feedback clock FBCLK may not also exceed one cycle tck of the external clocks CLK and CLK# and the source clock REFCLK.

Therefore, since one cycle tck of the external clocks CLK and CLK# and the source clock REFCLK is comparatively long, a delay amount of delaying the feedback clock FBCLK should be also long in order to synchronize the reference edge of the feedback clock FBCLK with the reference edge of the external clocks CLK and CLK# and the source clock REFCLK.

That is, when the frequencies of the external clocks CLK and CLK# and the source clock REFCLK are comparatively low, the feedback clock FBCLK should be delayed comparatively long to terminate the delay locking operation. Therefore, the delay locking operation may not be terminated even if the delay locked loop (DLL) circuit has reached the delay limit.

As described above, it may be difficult to completely synchronize a reference edge of a feedback clock FBCLK with a reference edge of external clocks CLK and CLK# and a source clock REFCLK when the frequencies of the external clocks CLK and CLK# and the source clock REFCLK are comparatively low. However, the register-controlled delay locked loop (DLL) circuit according to the third embodiment senses such an abnormal state, prevents power consumption caused by the delay locking operation by supplying the internal supply voltage IN_VDD instead of the external supply voltage VDD. At this moment, the reference edge of the feedback clock FBCLK is not significantly mismatched with the reference edge of the external clocks CLK and CLK# and the source clock REFCLK even if the delay locking operation does not completely terminate.

The delay locked loop circuit according to the third embodiment may not terminate the delay locking operation even if the delay amount has reached the delay limit. In this state of the delay locked loop circuit according to the third embodiment, frequencies of the external clocks CLK and CLK# and the source clock REFCLK are comparatively low. It means that the frequency of the DQ data outputted from the delay locked loop circuit is also comparatively low. Therefore, it does not cause any serious problems in reading a value of data even if the DQ data has a slight skew.

As described above, the delay locked loop circuit according to the third embodiment supplies the internal supply voltage IN_VDD instead of the external supply voltage VDD when the delay end signal DELAY_END_CTRL is activated to logic high. That is, the delay locking operation is forcedly terminated when the external clocks CLK and CLK# and the source clock REFCLK have a comparatively low frequency. In this state of the delay locked loop (DLL) circuit according to the third embodiment, one cycle tck of the external clocks CLK and CLK# and the source clock REFCLK becomes comparatively long. Therefore, a phase difference between the source clock REFCLK and the feedback clock FBCLK after a delay amount has reached the delay limit is comparatively short compared to one cycle of the external clock CLK and CLK# and the source clock REFCLK. This short phase difference does not influence reading the value of the DQ data outputted by the operation of the delay locked look (DLL) circuit, and the delay locked loop circuit according to the third embodiment sustains minimum power consumption.

Figure 5:
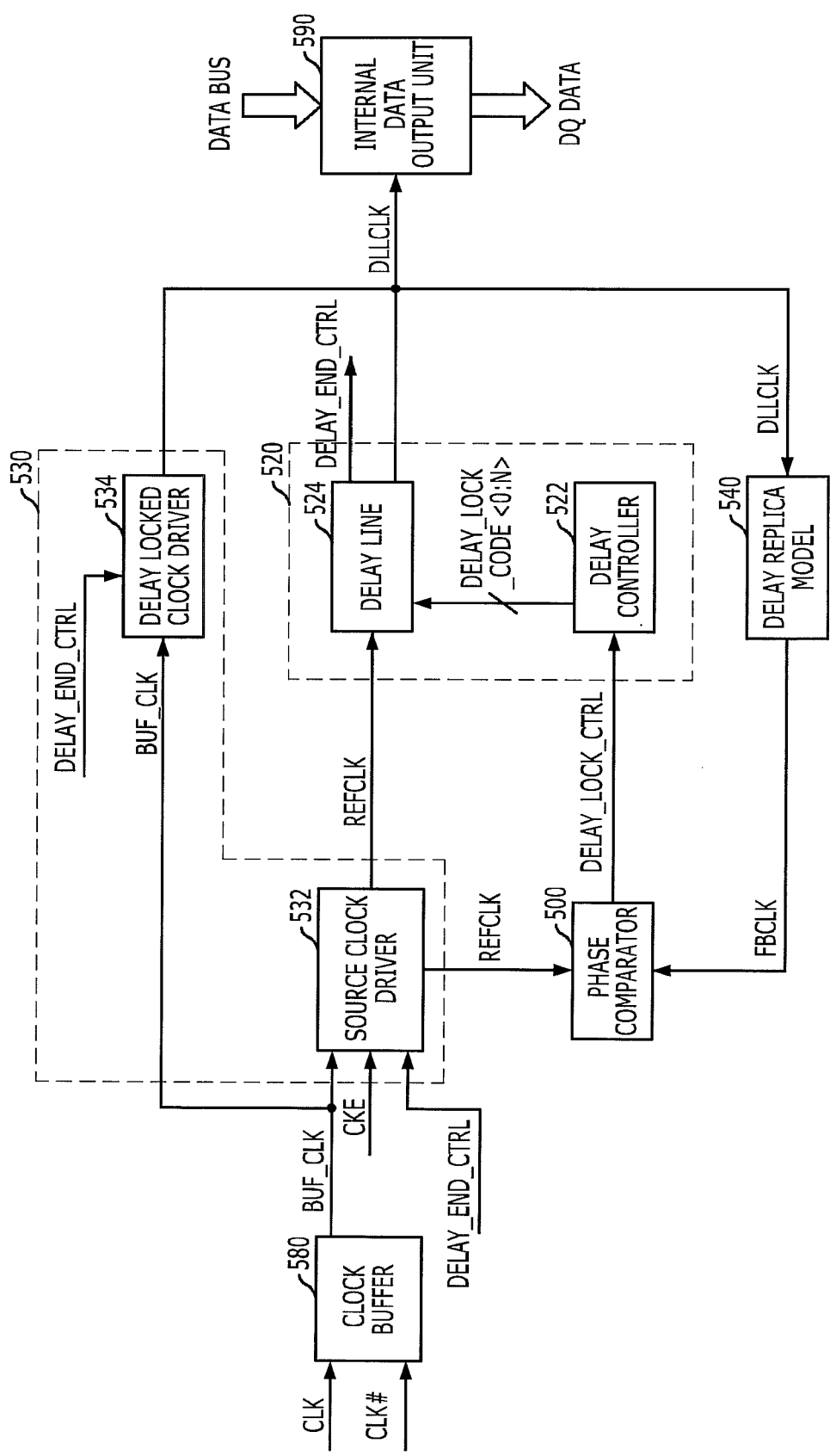
FIG. 5 is a block diagram illustrating a register-controlled delay locked loop (DLL) circuit in accordance with a fourth embodiment of the present invention.

FIG. 5 is a block diagram illustrating a register-controlled delay locked loop (DLL) according to a fourth embodiment of the present invention.

Referring to FIG. 5, the register-controlled delay locked loop (DLL) according to the fourth embodiment includes a clock buffer 580, a clock driver 530, a phase comparator 500, a clock delay 520, and a delay replica model 540.

The clock buffer 580 buffers a clock supplied from an external device. The clock driver 530 drives a clock BUF_CLK outputted from the clock buffer 580 during a delay locking enable period corresponding to a delay end signal DELAY_END_CTRL and outputs the driven clock as a source clock REFCLK. The clock driver 530 also drives the clock BUF_CLK outputted from the clock buffer 580 in a delay locking disable period corresponding to the delay end signal DELAY_END_CTRL and outputs the driven clock as a delay locked clock DLLCLK. Here, the clock outputted from the clock buffer 580 is substantially identical to clocks CLK and CLK# from an external device. The phase comparator 500 compares a phase of a source clock REFCLK with a phase of a feedback clock FBCLK and generates a delay locking signal DELAY_LOCK_CTRL based on the comparison result. The clock delay 520 delays the source clock REFCLK in response to the delay locking signal DELAY_LOCK_CTRL and outputs the delayed source clock as a delay locked clock DLLCLK and generates a delay end signal DELAY_END_CTRL when a delay amount has reached a delay limit. The delay replica model 540 outputs a feedback clock FBCLK by reflecting a delay time of an output path of the source clock REFCLK at the delay locked clock DLLCLK.

More specifically, the clock buffer 580 generates an internal clock BUF_CLK by buffering clocks CLK and CLK# from an external device.

The clock driver 530 includes a source clock driver 532 and a delay locked clock driver 534. The source clock driver 532 outputs a source clock REFCLK by driving the clock BUF_CLK outputted from the clock buffer 580 in response to a delay end signal DELAY_END_CTRL and a clock enable signal CKE. The delay locked clock driver 534 outputs a delay locked clock DLLCLK by driving the buffered clock BUF_CLK of the clock buffer 580 in response to the delay end signal DELAY_END_CTRL.

Here, the source clock driver 532 outputs a source clock REFCLK by driving the buffered clock BUF_CLK of the clock buffer 580 when a delay end signal DELAY_END_CTRL is inactivated to logic low during an activation period of the clock enable signal CLE.

Also, the source clock driver 532 controls the source clock not to be toggled by not driving the buffered clock BUF_CLK of the clock buffer 580 when the delay end signal DELAY_END_CTRL is activated to logic high during the activation period of the clock enable signal CKE.

Further, the source clock driver 532 controls the source clock REFCLK not to be toggled by not driving the buffered clock BUF_CLK of the clock buffer 580 regardless of a logic level of the delay end signal DELAY_END_CTRL during an inactivation state of the clock enable signal CKE.

That is, the source clock driver 532 determines whether the buffered clock BUF_CLK of the clock buffer 580 is outputted as the source clock REFCLK according to a logic level of the delay end signal DELAY_END_CTRL during the activation state (logic high) of the clock enable signal CKE. However, the source clock driver 532 controls the source clock REFCLK not to be toggled by controlling the buffered clock BUF_CLK of the clock buffer 580 not to be outputted as the source clock REFCLK regardless of a logic level of the delay end signal DELAY_END_CTRL during the inactivation state of the clock enable signal CKE.

For illustration purposes, a clock enable signal CKE may always sustain an activation state in a normal operation of a semiconductor memory device. However, the clock enable signal CKE may be inactivated in a specific operation mode such as a power down mode for reducing power consumption of a semiconductor memory device.

The delay locked clock driver 534 outputs a delay locked clock DLLCLK by driving the buffered clock BUF_CLK of the clock buffer 580 when the delay end signal DELAY_END_CTRL is activated to logic high and does not output a delay locked clock DLLCKL by not driving the buffered clock BUF_CLK of the clock buffer 580 when the delay end signal DELAY_END_CTRL is inactivated to logic low.

When the delay end signal DELAY_END_CTRL is activated to logic high, the delay locked clock DLLCLK outputted from the delay locked clock driver 534 is delayed by as much as a predetermined time compared to the buffered clock BUF_CLK of the clock buffer 580. The predetermined time may be decided according to design needs. However, it is preferable that the predetermined time is identical to delay limit of a delay locked loop (DLL) circuit.

The phase comparator 500 activates a delay locking signal DELAY_LOCK_CTRL to logic high and outputs the activated delay locking signal DELAY_LOCK_CTRL when a reference edge of a feedback clock FBCLK is behind a reference edge of a source clock REFCLK at an update time, which is repeated at a predetermined interval while performing a delay locking operation. Here, the reference edge of the source clock REFCK is a rising edge in general. However, it is not limited thereto. The reference edge of the source clock REFCK may be a falling edge. Also, the phase comparator 500 inactivates the delay locking signal DELAY_LOCK_CTRL to logic low and outputs the inactivated delay locking signal DELAY_LOCK_CTRL when a reference edge of feedback clock FBCLK is ahead of a reference edge of the source clock REFCLK at an update time, which is repeated at a predetermined interval while a delay locking operation is performed.

The clock delay 520 includes a delay controller 522 and a delay line 524. The delay controller 522 changes a value of a delay locking code DELAY_LOCK_CODE<0:N> formed of a plurality of bits in response to the delay locking signal DELAY_LOCK_CTRL. The delay line 524 delays a source clock REFCLK by as much as a delay amount corresponding to the value of the delay locking code DELAY_LOCK_CODE<0:N>. Here, when the value of delay locking code DELAY_LOCK_CODE<0:N> is larger than a value of a delay limit, the delay line 524 activates the delay end signal DELAY_END_CTRL.

The delay controller 522 changes a value of delay locking code DELAY_LOCK_CODE<0:N> in response to a delay locking signal DELAY_LOCK_CTRL at a update time, which is repeated at a predetermined interval during the performance of the delay locking operation. The delay controller 522 does not change the value of delay locking code DELAY_LOCK_CODE<0:N> regardless of the update time and regardless of a value of the delay locking signal DELAY_LOCK_CTRL after the delay locking operation terminate.

That is, the delay controller 522 increases the value of delay locking code DELAY_LOCK_CODE<0:N> when the delay locking signal DELAY_LOCK_CTROL is activated to logic high at every update time, which is repeated at a predetermined interval. Also, the delay controller 522 decreases the value of delay locking code DELAY_LOCK_CODE<0:N> when the delay locking signal DELAY_LOCK_CTRL is inactivated to logic low at every update time, which is repeated at a predetermined interval.

The delay line 524 delays a source clock REFCLK by as much as a delay amount corresponding to a value of the delay locking code DELAY_LOCK_CODE<0:N> and outputs the delayed source clock REFCLK as a delay locked clock DLLCLK. Here, the delay amount corresponding to the value of delay locking code DELAY_LOCK_CODE<0:N> should be set to a comparative value.

For example, it is assumed that the delay locking code DELAY_LOCK_CODE<0:N> is a four-bit signal. Under this assumption, if the value of the delay locking code DELAY_LOCK_CODE<0:N> is '0 0 0 0', the delay line 524 may be set to not delay the source clock REFCLK and output the source clock REFCLK as a delay locked clock DLLCLK. The delay line 524 may be set to delay the source clock REFCLK longer and output the delayed source clock REF-CLK as the delay locked clock DLLCLK as the value of the delay locking code DELAY_LOCK_CODE<0:N> increases for example from '0 0 0 1', '0 0 1 0', '0 0 1 1', '0 1 0 0', . . . , to '1 1 1 1'. Here, the delay locking code DELAY_LOCK_CODE<0:N> may have a predetermined initial value at a beginning of the delay locking operation. In general, the initial value may be set as a middle value such as '0 1 1 0' rather than the smallest value '0 0 0 0'.

Even if it is not shown in the drawing, the delay line 524 may include a plurality of unit delays. In this case, the delay line 524 may be set to delay the source clock REFCLK longer and output the delayed source clock REFCLK as the delay locked clock DLLCLK as the value of the delay locking code DELAY_LOCK_CODE<0:N> increases. On the contrary, the delay line 524 may be set to delay the source clock REFCLK less by using less number of the unit delays and output the delayed source clock REFCLK as the delay locked clock DLLCLK as the value of the delay locking code DELAY_LOCK_CODE<0:N> decreases.

The number of the unit delays in the delay line 524 may be set according to design needs. The number of the unit delay may not be changed after being set up during the initial design. Also, the size of the delay line 524 increases in proportion to the number of unit delays. Therefore, it is inefficient to increase the number of unit delays without limitation.

Therefore, it is desirable to set a delay limit. The limit delay limits a delay amount of the delay line 524 to delay the source clock REFCLK. If a phase of a source clock REFLCK is not synchronized with a phase of a feedback clock FBCLK after a delay amount has reached the delay limit like the related art, a value of the delay locking code DELAY_LOCK_CODE<0:N> may increase continually. In this case, a delay locking operation will never terminate.

In order to overcome such a problem of the related art, the delay line 524 according to the fourth embodiment activates the delay end signal DELAY_END_CTRL to logic high and outputs the activated delay end signal DELAY_END_CTRL if a delay amount has reached the delay limit.

Also, the clock driver 530 controls the source clock REFCLK not to be toggled by not driving the buffered clock BUF_CLK outputted from the clock buffer 580 when the delay end signal DELAY_END_CTRL is activated to logic high. At the same time, the clock driver 530 directly drives the buffered clock BUF_CLK as the delay locked clock DLLCLK. Therefore, the clock driver 530 can control the delay locked clock DLLCLK to output without operating other components such as the phase comparator 500, the clock delay 520, and the delay replica model 540 because the delay amount has reached delay limit. That is, by directly driving the buffered clock BUF_CLK outputted from the clock buffer 580 as the delay locked clock DLLCLK, it is possible to eliminate power consumption wasted by the delay locking operation.

As described above, the register-controlled delay locked loop DLL according to the fourth embodiment senses that a phase difference between the source clock REFCK and the outputted delay locked clock DLLCLK has reached a maximum value and controls the operation of the register-controlled delay locked loop DLL based on the sensing result. Therefore, the resister controlled delay locked loop DLL according to the fourth embodiment can completely eliminate power consumption caused by the operation of the register-controlled delay locked look DLL circuit.

In the fourth embodiment, the delay end signal DELAY_END_CTRL is activated to logic high when the delay amount of the delay line 524 has reached the delay limit. In this case, the phase of the delay locked clock DLLCLK is not synchronized with the phase of the external clocks CLK and CLK# even if the buffered clock BUF_CLK outputted from the clock buffer 580 is directly controlled as the delay locked cock DLLCLK. Therefore, a phase of DQ data outputted from an internal data output unit 590 may not be synchronized with external data clocks CLK and CLK#. Even if the phase of DQ data is not synchronized with the external clocks CLK and CLK#, the register-controlled delay locked look according to the fourth embodiment can still effectively perform the delay locking operation. It will be described in detail with reference to FIG. 7.

FIG. 7 is a timing diagram for describing a delay locking operation according to the fourth embodiment of the present invention. As shown, the external clocks CLK and CLK# and the source clock REFCLK may have a high frequency as shown in a diagram (A) and may have a low frequency as shown in a diagram (B). For illustration purposes, phases of the external clocks CLK and CLK# may not be accurately synchronized with a phase of the source clock REFCLK.

As shown in the diagram (A), since the external clocks CLK and CLK# and the source clock REFCLK have comparatively high frequency, one cycle tck of the external clocks CLK and CLK# and the source clock REFCLK is also comparatively short.

Here, a phase difference between a reference edge of the external clocks CLK and CLK# and the source clock REFCLK and a reference edge of a feedback clock FBCLK may not exceed one cycle tck of the external clocks CLK and CLK# and the source clock REFCLK. Therefore, a delay amount of delaying the feedback clock FBCLK may not exceed the one cycle tck of the external clocks CLK and CLK# and the source clock REFCLK in order to synchronize a reference edge of the feedback clock FBCLK with a reference edge of external clocks CLK and CLK# and the source clock REFCLK. That is, when frequencies of the external clocks CLK and CLK# and the source clock REFCLK are comparatively high, the delay locking operation can terminate even if the feedback clock FBCLK is delayed slightly. Therefore, it is possible to terminate the delay locking operation without using the maximum delay limit of the delay locked loop DLL.

On the contrary, as shown in the timing diagram (B), since frequencies of the external clocks CLK and CLK# and the source clock REFCLK are comparatively low, one cycle tck of the external clocks CLK and CLK# and the source clock REFCLK is comparatively long.

Here, a phase difference of a reference edge of the external clocks CLK and CLK# and the source clock REFCLK and a reference edge of a feedback clock FBCLK may not exceed one cycle tck of the external clocks CLK and CLK# and the source clock REFCLK. In order to synchronize the reference edge of the feedback clock FBCLK with the reference edge of the external clocks CLK and CLK# and the source clock REFCLK, a delay amount of delaying the feedback clock FBCLK may not also exceed one cycle tck of the external clocks CLK and CLK# and the source clock REFCLK.

Therefore, since one cycle tck of the external clocks CLK and CLK# and the source clock REFCLK is comparatively long, a delay amount of delaying the feedback clock FBCLK should be also long in order to synchronize the reference edge of the feedback clock FBCLK with the reference edge of the external clocks CLK and CLK# and the source clock REFCLK.

That is, when the frequencies of the external clocks CLK and CLK# and the source clock REFCLK are comparatively low, the feedback clock FBCLK should be delayed comparatively long to terminate the delay locking operation. Therefore, the delay locking operation may not be terminated even if the delay locked loop (DLL) circuit has reached the delay limit.

As described above, it may be difficult to completely synchronize a reference edge of a feedback clock FBCLK with a reference edge of external clocks CLK and CLK# and a source clock REFCLK when the frequencies of the external clocks CLK and CLK# and the source clock REFCLK are comparatively low. However, the register-controlled delay locked loop (DLL) circuit according to the fourth embodiment senses such an abnormal state and directly drives the buffered clock BUF_CLK from the clock buffer 580 as the delay locked clock DLLCLK. That is, the delay locked clock DLLCLK is delayed by as much as delay limit of the delay locked look DLL compared to the buffered clock BUF_CLK outputted from the clock buffer 580. At this moment, a reference edge of the feedback clock FBCLK is not significantly mismatched with a reference edge of the external clock CLK and CLK# similar to that the reference edge of the feedback clock FBCLK is not significantly mismatched with the reference edge of the external clocks CLK and CLK# and the source clock REFCLK even if the delay locking operation is terminated.

The delay locked loop circuit according to the fourth embodiment may not terminate the delay locking operation even if the delay amount has reached the delay limit. In this state of the delay locked loop circuit according to the fourth embodiment, frequencies of the external clocks CLK and CLK# and the source clock REFCLK are comparatively low. It means that the frequency of the DQ data outputted from the delay locked loop circuit is also comparatively low. Therefore, it does not cause any serious problems in reading a value of data even if the DQ data has a slight skew.

As described above, the delay locked loop circuit according to the fourth embodiment directly drives the buffered clock BUF_CLK outputted from the clock buffer 580 as the delay locked clock DLLCLK when the delay end signal DELAY_END_CTRL is activated to logic high, that is, the when the external clocks CLK and CLK# and the source clock REFCLK have a comparatively low frequency. In this state of the delay locked loop (DLL) circuit according to the fourth embodiment, one cycle tck of the external clocks CLK and CLK# and the source clock REFCLK becomes comparatively long. Therefore, a phase difference between the source clock REFCLK and the feedback clock FBCLK after a delay amount has reached the delay limit is comparatively short compared to one cycle of the external clock CLK and CLK# and the source clock REFCLK. This short phase difference does not influence reading the value of the DQ data outputted by the operation of the delay locked look (DLL) circuit even if the internal data output unit 590 outputs data DQ DATA using the delay locked clock DLLCLK generated by the clock driver 530 through the delay of the external clock CLK and CLK# by as much as the delay limit of the delay locked look DLL circuit.

Figure 6:
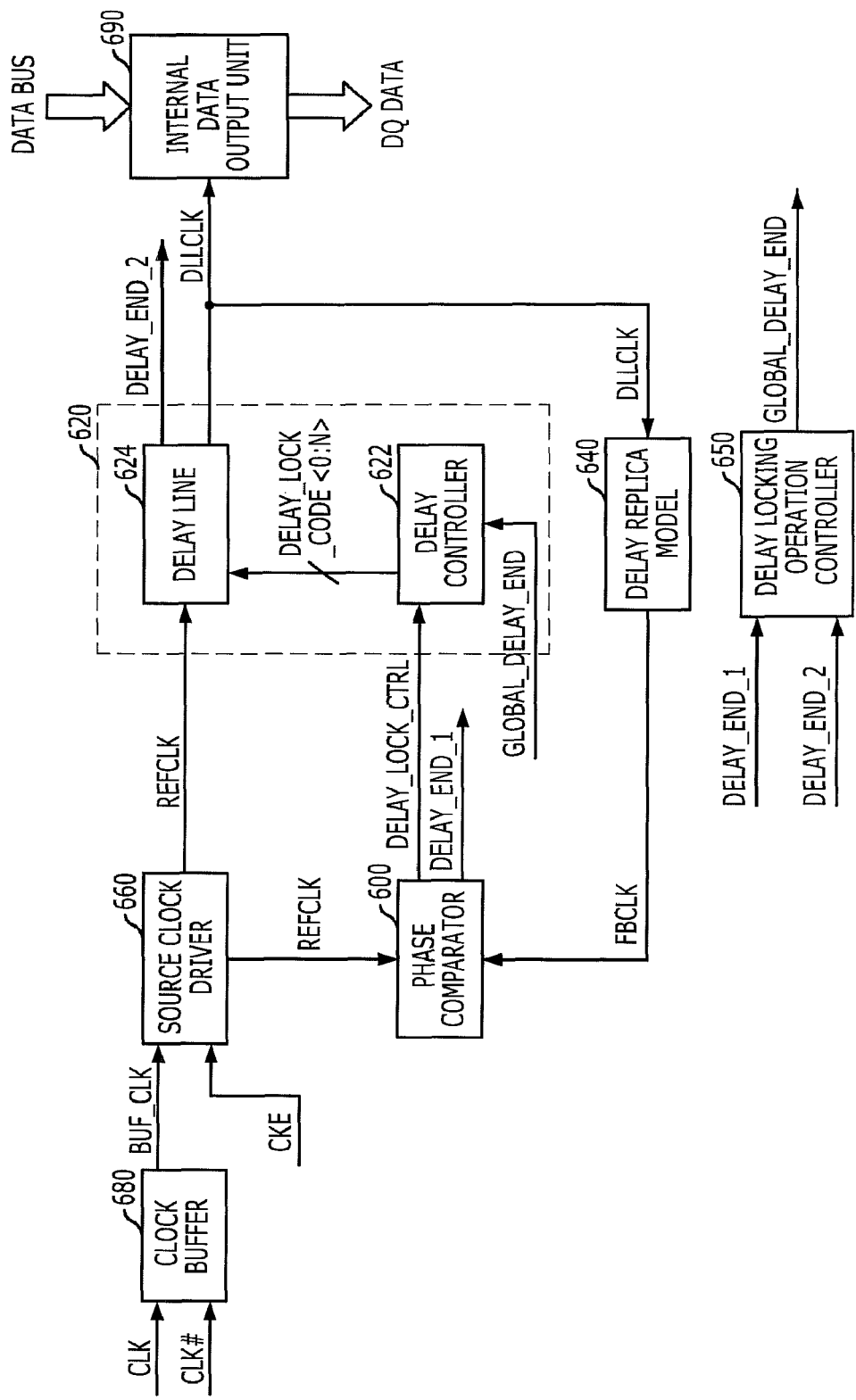
FIG. 6 is a block diagram illustrating a register-controlled delay locked loop (DLL) circuit in accordance with a fifth embodiment of the present invention.

FIG. 6 is a block diagram illustrating a register-controlled delay locked loop (DLL) according to a fifth embodiment of the present invention.

Referring to FIG. 6, the register-controlled delay locked loop (DLL) according to the fifth embodiment includes a clock buffer 680, a source clock driver 660, a phase comparator 600, a clock delay 620, a delay replica model 640, and a delay locking operation controller 650.

The clock buffer 680 buffers a clock supplied from an external device. The source clock driver 660 drives an output clock BUF_CLK of the clock buffer 680 in response to a clock enable signal CKE to output as a source clock REFCLK. The phase comparator 600 compares a phase of a source clock REFCLK with a phase of a feedback clock FBCLK and generates a delay locking signal DELAY_LOCK_CTRL and a first delay end signal DELAY_END_1 based on the comparison result. The clock delay 620 delays the source clock REFCLK in response to the delay locking signal DELAY_LOCK_CTRL and outputs the delayed source clock as a delay locked clock DLLCLK and generates a second delay end signal DELAY_END_2 in response to reaching a delay limit. The delay replica model 640 outputs a feedback clock FBCLK by reflecting a delay time of an output path of the source clock REFCLK at the delay locked clock DLLCLK. The delay locking operation controller 650 terminates a delay locking operation in response to the first delay end signal DELAY_END1 and the second delay end signal DELAY_END_2.

More specifically, the clock buffer 680 generates a clock BUF_CLK used internally by buffering clocks CLK and CLK# supplied from an external device.

The source clock driver 660 outputs a buffered clock BUF_CLK as a source clock REFCLK during a period where a clock enable signal CKE is activated. The source clock driver 660 does not output the buffered clock BUF_CLK as a source clock REFCLK during a period where a clock enable signal CKE is inactivated. That is, the source clock REFCLK toggles identically to the buffered clock BUF_CLK during the activation period of the clock enable signal CKE. On the contrary, the source clock REFCLK do not toggle, irrespective of the buffered clock BUF_CLK, in the inactivation period of the clock enable signal CKE.

For illustration purposes, a clock enable signal CKE may always sustain an activation state in a normal operation of a semiconductor memory device. However, the clock enable signal CKE may be inactivated in a specific operation mode such as a power down mode for reducing power consumption of a semiconductor memory device.

The phase comparator 600 activates a delay locking signal DELAY_LOCK_CTRL to logic high and outputs the activated delay locking signal DELAY_LOCK_CTRL when a reference edge of a feedback clock FBCLK is behind a reference edge of a source clock REFCLK at an update time, which is repeated at a predetermined interval while performing a delay locking operation. Here, the reference edge of the source clock REFCK generally indicates a rising edge. However, it is not limited thereto. The reference edge of the source clock REFCK may be a falling edge. Also, the phase comparator 600 inactivates the delay locking signal DELAY_LOCK_CTRL to logic low and outputs the inactivated delay locking signal DELAY_LOCK_CTRL when a reference edge of feedback clock FBCLK is ahead of a reference edge of the source clock REFCLK at an update time, which is repeated at a predetermined interval while a delay locking operation is performed.

The phase comparator 600 activates the first delay end signal DELAY_END_1 to logic high when the delay locking signal DELAY_LOCK_CTRL is changed between an activation state of logic high and an inactivation state of logic low while an update time is repeated as many as predetermined time during the performance of a delay locking operation.

Also, the phase comparator 600 inactivates the first delay end signal DELAY_END_1 when the delay locking signal DELAY_LOCK_CTRL sustains an activation state of logic high or an inactivation state of logic low while the update time is repeated as many as predetermined times during the performance of the delay locking operation.

The delay locking operation controller 650 activates a global delay end signal GLOBAL_DELAY_END to logic high outputted when at least one of the first delay end signal DELAY_END_1 and the second delay end signal DELAY_END_2 is activated to logic high. The delay locking operation controller 650 locks a delay amount of the clock delay 620 by activating the global end signal GLOBAL_DELAY_END to logic high and terminates the delay locking operation.

That is, the delay locking operation controller 650 inactivates the global delay end signal GLOBAL_DELAY_END to logic low only when both of the first delay end signal DELAY_END_1 and the second delay end signal DELAY_END_2 are inactivated, thereby continually performing the delay locking operation in order to change a delay amount of the clock delay 620.

For illustration purposes, even if it is not shown in the drawing, the delay locking operation controller 650 includes a NOR gate for receiving the first delay end signal DELAY_END_1 and the second delay end signal DELAY_END_2 and an inverter for receiving an output signal of the NOR gate and outputting the received data as the global end signal GLOBAL_DELAY_END.

The clock delay 620 changes a value of a delay locking code DELAY_LOCK_CODE<0:N> formed of a plurality of bits in response to the delay locking signal DELAY_LOCK_CTRL. The clock delay 620 includes a delay controller 622 and a delay line 624. The delay controller 622 locks a value of delay locking code DELAY_LOCK_CODE<0:N> in response to an output signal GLOBAL_DELAY_END of the delay locking operation controller 650. The delay line 624 delays a source clock REFCLK by as much as a delay amount corresponding to the value of the delay locking code DELAY_LOCK_CODE<0:N>. Here, when the value of delay locking code DELAY_LOCK_CODE<0:N> is larger than a value of a delay limit, the delay line 624 activates the second delay end signal DELAY_END_2.

The delay controller 622 changes a value of delay locking code DELAY_LOCK_CODE<0:N> in response to a delay locking signal DELAY_LOCK_CTRL at a update time, which is repeated at a predetermined interval in the inactivation state of the output signal GLOBAL_DELAY_END of the delay locking operation controller 650 during the delay locking operation is performed. The delay controller 622 does not change the value of delay locking code DELAY_LOCK_CODE<0:N> regardless of the update time and regardless of a value of the delay locking signal DELAY_LOCK_CTRL in the activation state (logic high) of the output signal GLOBAL_DELAY_END of the delay locking operation controller 650 during the delay locking operation is performed. Further, the delay controller 622 does not change the value of delay locking code DELAY_LOCK_CODE<0:N>, irrespective of the update time and irrespective of the value of delay locking signal DELAY_LOCK_CTRL, after the delay locking operation ends.

That is, if the delay locking operation is performed and if the output signal GLOBAL_DELAY_END of the delay locking operation controller 650 is inactivated to logic low, the delay controller 622 increases the value of delay locking code DELAY_LOCK_CODE<0:N> when the delay locking signal DELAY_LOCK_CTROL is activated to logic high at every update time, which is repeated at a predetermined interval. Also, the delay controller 622 decreases the value of delay locking code DELAY_LOCK_CODE<0:N> when the delay locking signal DELAY_LOCK_CTRL is inactivated to logic low at every update time, which is repeated at a predetermined interval.

The delay line 624 delays a source clock REFCLK by as much as a delay amount corresponding to a value of the delay locking code DELAY_LOCK_CODE<0:N> and outputs the delayed source clock REFCLK as a delay locked clock DLLCLK. Here, the delay amount corresponding to the value of delay locking code DELAY_LOCK_CODE<0:N> should be set to a comparative value.

For example, it is assumed that the delay locking code DELAY_LOCK_CODE<0:N> is a four-bit signal. Under this assumption, if the value of the delay locking code DELAY_LOCK_CODE<0:N> is '0 0 0 0', the delay line 624 may be set to not delay the source clock REFCLK and output the source clock REFCLK as a delay locked clock DLLCLK. The delay line 624 may be set to delay the source clock REFCLK more and output the delayed source clock REFCLK as the delay locked clock DLLCLK as the value of the delay locking code DELAY_LOCK_CODE<0:N> increases for example from '0 0 0 1', '0 0 1 0', '0 0 1 1', '0 1 0 0', . . . , to '1 1 1 1'. Here, the delay locking code DELAY_LOCK_CODE<0:N> may have a predetermined initial value at a beginning of the delay locking operation. In general, the initial value may be set as a middle value such as '0 1 1 0' rather than the smallest value '0 0 0 0'.

Although it is not shown in the drawing, the delay line 624 may include a plurality of unit delays. In this case, the delay line 624 may be set to delay the source clock REFCLK longer and output the delayed source clock REFCLK as the delay locked clock DLLCLK as the value of the delay locking code DELAY_LOCK_CODE<0:N> increases. On the contrary, the delay line 624 may be set to delay the source clock REFCLK less by using less number of the unit delays and output the delayed source clock REFCLK as the delay locked clock DLLCLK as the value of the delay locking code DELAY_LOCK_CODE<0:N> decreases.

The number of the unit delays in the delay line 624 may be set according to design needs. The number of the unit delay may not be changed after being set up during the initial design. Also, the size of the delay line 624 increases in proportion to the number of unit delays. Therefore, it is inefficient to increase the number of unit delays without limitation.

Therefore, it is desirable to set a delay limit. The limit delay limits a delay amount of the delay line 624 to delay the source clock REFCLK. If a phase of a source clock REFLCK is not synchronized with a phase of a feedback clock FBCLK after a delay amount has reached the delay limit like the related art, a value of the delay locking code DELAY_LOCK_CODE<0:N> may increase continually. In this case, a delay locking operation will never terminate.

In order to overcome such a problem of the related art, the delay line 624 according to the fifth embodiment activates the second delay end signal DELAY_END_2 to logic high and outputs the activated second delay end signal DELAY_END_2 if a delay amount has reached the delay limit.

At the same time, the delay locking operation controller 650 activate the global delay end signal GLOBAL_DELAY_END to logic high and outputs the activated global delay end signal GLOBAL_DELAY_END when the second delay end signal DELAY_END_2 and the delay controller 622 locks the value of delay locking code DELAY_LOCK_CODE<0:N> when the global delay end signal GLOBAL_DELAY_END outputted from the delay locking operation controller 650 is activated. As a result, the delay locking operation is forcedly terminated.

As described above, the register-controlled delay locked loop DLL according to the fifth embodiment can forcedly terminal the delay locking operation when the register-controlled delay locked loop senses that a phase difference between the source clock REFCK and the outputted delay locked clock DLLCLK has reached a maximum value. In the foregoing manner, the resister controlled delay locked loop DLL according to the fifth embodiment can prevent the delay locking operation from unlimitedly repeating.

When the delay amount of the delay line 624 has reached the delay limit, the delay locking operation is terminated by activating the global delay end signal GLOBAL_DELAY_END of the delay locking operation controller 650 to logic high. In this case, the phase of the source clock REFCLK is not synchronized with the phase of the feedback clock FBCLK even if the delay locking operation is terminated. Therefore, a phase of DQ data outputted from an internal data output unit 690 may not be synchronized with external clocks CLK and CLK#. Even if the phase of DQ data is not synchronized with the external clocks CLK and CLK#, the register-controlled delay locked look according to the fifth embodiment can still effectively perform the delay locking operation. It will be described in detail with reference to FIG. 7.

FIG. 7 is a timing diagram for describing a delay locking operation according to the fifth embodiment of the present invention. As shown, the external clocks CLK and CLK# and the source clock REFCLK may have a high frequency as shown in a diagram (A) and may have a low frequency as shown in a diagram (B). For illustration purposes, phases of the external clocks CLK and CLK# may not be accurately synchronized with a phase of the source clock REFCLK.

As shown in the diagram (A), since the external clocks CLK and CLK# and the source clock REFCLK have comparatively high frequency, one cycle tck of the external clocks CLK and CLK# and the source clock REFCLK is also comparatively short.

Here, a phase difference between a reference edge of the external clocks CLK and CLK# and the source clock REFCLK and a reference edge of a feedback clock FBCLK may not exceed one cycle tck of the external clocks CLK and CLK# and the source clock REFCLK. Therefore, a delay amount of delaying the feedback clock FBCLK may not exceed the one cycle tck of the external clocks CLK and CLK# and the source clock REFCLK in order to synchronize a reference edge of the feedback clock FBCLK with a reference edge of external clocks CLK and CLK# and the source clock REFCLK.

That is, when frequencies of the external clocks CLK and CLK# and the source clock REFCLK are comparatively high, the delay locking operation can terminate even if the feedback clock FBCLK is delayed slightly. Therefore, it is possible to terminate the delay locking operation without using the maximum delay limit of the delay locked loop DLL.

On the contrary, as shown in the timing diagram (B), since frequencies of the external clocks CLK and CLK# and the source clock REFCLK are comparatively low, one cycle tck of the external clocks CLK and CLK# and the source clock REFCLK is comparatively long.

Here, a phase difference of a reference edge of the external clocks CLK and CLK# and the source clock REFCLK and a reference edge of a feedback clock FBCLK may not exceed one cycle tck of the external clocks CLK and CLK# and the source clock REFCLK. In order to synchronize the reference edge of the feedback clock FBCLK with the reference edge of the external clocks CLK and CLK# and the source clock REFCLK, a delay amount of delaying the feedback clock FBCLK may not exceed one cycle tck of the external clocks CLK and CLK# and the source clock REFCLK.

Therefore, since one cycle tck of the external clocks CLK and CLK# and the source clock REFCLK is comparatively long, a delay amount of delaying the feedback clock FBCLK should be also long in order to synchronize the reference edge of the feedback clock FBCLK with the reference edge of the external clocks CLK and CLK# and the source clock REFCLK.

That is, when the frequencies of the external clocks CLK and CLK# and the source clock REFCLK are comparatively low, the feedback clock FBCLK should be delayed comparatively long to terminate the delay locking operation. Therefore, the delay locking operation may not be terminated even if the delay locked loop (DLL) circuit has reached the delay limit.

As described above, it may be difficult to completely synchronize a reference edge of a feedback clock FBCLK with a reference edge of external clocks CLK and CLK# and a source clock REFCLK when the frequencies of the external clocks CLK and CLK# and the source clock REFCLK are comparatively low. However, the register-controlled delay locked loop (DLL) circuit according to the fifth embodiment senses such an abnormal state and forcedly terminates the delay locking operation. At this moment, the reference edge of the feedback clock FBCLK is not significantly mismatched with the reference edge of the external clocks CLK and CLK# and the source clock REFCLK even if the delay locking operation is terminated.

The delay locked loop circuit according to the fifth embodiment may not terminate the delay locking operation even if the delay amount has reached the delay limit. In this state of the delay locked loop circuit according to the fifth embodiment, frequencies of the external clocks CLK and CLK# and the source clock REFCLK are comparatively low. It means that the frequency of the DQ data outputted from the delay locked loop circuit is also comparatively low. Therefore, it does not cause any serious problems in reading a value of data even if the DQ data has a slight skew.

As described above, the delay locked loop circuit according to the fifth embodiment forcedly terminates the delay locking operation when the second delay end signal DELAY_END_2 is activated to logic high. That is, the delay locking operation is forcedly terminated when the external clocks CLK and CLK# and the source clock REFCLK have a comparatively low frequency. In this state of the delay locked loop (DLL) circuit according to the fifth embodiment, one cycle tck of the external clocks CLK and CLK# and the source clock REFCLK becomes comparatively long. Therefore, a phase difference between the source clock REFCLK and the feedback clock FBCLK after a delay amount has reached the delay limit is comparatively short compared to one cycle of the external clock CLK and CLK# and the source clock REFCLK. This short phase difference does not influence reading the value of the DQ data outputted by the operation of the delay locked look (DLL) circuit.

As described above, the register-controlled delay locked loop circuit according to the present invention senses whether a phase difference between an inputted source clock REFCLK and an outputted delay locked clock DLLCLK has reached the maximum value or not and forcedly terminates the delay locking operation based on the sensing result. Therefore, the register-controlled delay locked loop circuit according to the present invention can prevent the delay locking operation from infinitely repeating.

Also, the register-controlled delay locked loop circuit according to the present invention can sustain power consumption of the delay locking operation at a minimum level by controlling a voltage level of a supply voltage based on the sensing result.

Further, the register-controlled delay locked loop circuit according to the present invention can completely eliminate power consumption caused by operation of the delay locked loop circuit by controlling the operation of the delay locked loop circuit based on the sensing result.

While the present invention has been described with respect to the specific embodiments, it will be apparent to those skilled in the art that various changes and modifications may be made without departing from the spirit and scope of the invention as defined in the following claims.

For example, the logic gates and the transistors described in the above specification may be modified in locations and types according to a polarity of a signal.

As described above, the register-controlled delay locked loop circuit according to the present invention senses whether a phase difference between an inputted source clock REFCLK and an outputted delay locked clock DLLCLK has reached the maximum value or not and forcedly terminates the delay locking operation based on the sensing result. Therefore, the register-controlled delay locked loop circuit according to the present invention can prevent the delay locking operation from infinitely repeating.

Also, the register-controlled delay locked loop circuit according to the present invention senses whether a phase difference between an inputted source clock REFCLK and an outputted delay locked clock DLLCLK has reached the maximum value or not and can sustain power consumption of the delay locking operation at a minimum level by controlling a voltage level of a supply voltage based on the sensing result.

Further, the register-controlled delay locked loop circuit according to the present invention senses whether a phase difference between an inputted source clock REFCLK and an outputted delay locked clock DLLCLK has reached the maximum value or not and drives internal data outputted from a core region of a semiconductor memory device to the outside according to the sensing result. Therefore, the reliability of operation thereof can be improved.

Moreover, the register-controlled delay locked loop circuit according to the present invention senses whether a phase difference between an inputted source clock REFCLK and an outputted delay locked clock DLLCLK has reached the maximum value or not and can completely eliminate power consumption caused by operation of the delay locked loop circuit by controlling the operation of the delay locked loop circuit based on the sensing result.

What is claimed is:

1. A delay locked loop circuit comprising:
   a phase comparator configured to compare a phase of a source clock with a phase of a feedback clock and generate a delay locking signal based on the comparison result;
   a clock delay configured to delay the source clock in response to the delay locking signal for locking delay, output the delayed source clock as a delay locked clock, and generate a delay end signal when a delay amount has reached a delay limit;
   a delay replica model configured to reflect a delay time of an output path of the source clock at the delay locked clock and output the reflected clock as the feedback clock; and
   a delay locking operation controller configured to terminate a delay locking operation in response to the delay locking signal and the delay end signal.

2. The delay locked loop circuit of claim 1, wherein the clock delay includes:
   a delay controller configured to change a value of a delay locking code formed of a plurality of bits in response to the delay locking signal and lock the value of the delay locking code in response to an output signal of the delay locking operation controller; and
   a delay line configured to delay the source clock by as much as a delay amount corresponding to the value of the delay locking code and activate the delay end signal when the value of the delay locking code is greater than a value corresponding to the delay limit.

3. The delay locked loop circuit of claim 2, wherein the delay controller changes the value of the delay locking code in response to the delay locking signal at every update time, which is repeated at a predetermined interval when an output signal of the delay locking operation controller is inactivated while performing the delay locking operation,
   wherein the delay controller does not change the value of the delay locking code, regardless of the update time and the value of the delay locking signal, when the output signal of the delay locking operation controller is activated while performing the delay locking operation, and
   wherein the delay controller does not change the value of the delay locking code, regardless of the update time and the value of the delay locking signal, after the delay locking operation terminates.

4. The delay locked loop circuit of claim 3, wherein the delay controller increase the value of the delay locking code when the delay locking signal is in an activation state at the update time and decreases the value of the delay locking code when the delay locking signal is in an inactivation state.

5. The delay locked loop circuit of claim 1, wherein, while the delay locking signal is in an inactivation state, the delay locking operation controller locks a delay amount of the clock delay by activating an output signal when the delay locking signal is repeatedly changed between an activation state and an inactivation state while the update time is repeated predetermined times.

6. The delay locked loop circuit of claim 5, wherein, while the delay end signal is in an activation state, the delay locking operation controller locks a delay amount of the clock delay and terminates a delay locking operation by activating an output signal regardless of a logic level of the delay locking signal.

7. A semiconductor memory device comprising:
- a phase comparator configured to compare a phase of a source clock with a phase of a feedback clock and generate a delay locking signal corresponding to the comparison result;
- a clock delay configured to delay the source clock and output the delayed source clock as a delay locked clock in response to the delay locking signal for locking delay, and generate a delay end signal when a delay amount has reached a delay limit;
- a delay replica model configured to reflect a delay time of an output path of the source clock at the delay locked clock and output the reflected clock as the feedback clock; and
- an internal data output unit configured to synchronize internal data at the delay locked clock and output the synchronized data, and configured to be turned On/Off in response to the delay locking signal and the delay end signal,
- wherein a delay locking operation by the phase comparator, the clock delay and the delay replica model is substantially terminated when the internal data output unit outputs the synchronized data in response to the delay end signal.

8. The semiconductor memory device of claim 7, wherein the clock delay includes:
- a delay controller configured to change a value of a delay locking code formed of a plurality of bits in response to the delay locking signal; and
- a delay line configured to delay the source clock by as much as a delay amount corresponding to a value of the delay locking code and output the delayed source clock as the delay locked clock, and activate the delay end signal when the value of the delay locking code is greater than a value corresponding to the delay limit.

9. The semiconductor memory device of claim 8, wherein the delay controller changes the value of the delay locking code in response to the delay locking signal at a update time, which is repeated at a predetermined interval while performing a delay locking operation, and
- wherein the delay controller does not change the value of the delay locking code regardless of the update time and a value of the delay locking signal after a delay locking operation terminates.

10. The semiconductor memory device of claim 9, wherein the delay controller increases the value of the delay locking code when the delay locking signal is in an activation state at the update time, and
- wherein the delay controller decreases the value of the delay locking code when the delay locking signal is in an inactivation state.

11. The semiconductor memory device of claim 7, wherein, while the delay end signal is in an inactivation state, the internal data output unit is turned off and does not output internal data in response to performance of a delay locking operation corresponding to the delay locking signal, and
- wherein, while the delay end signal is in an inactivation state, the internal data output unit is turned on, synchronizes internal data with the delay locked clock, and outputs the synchronized data.

12. The semiconductor memory device of claim 11, wherein, while the delay end signal is in an activation state, the internal data output unit is turned on regardless of whether a delay locking operation is performed or not corresponding to the delay locking signal, synchronizes internal data at the delay locked clock, and outputs the synchronized data.

13. A delay locked loop circuit comprising:
- a supply voltage selector configured to selectively supply one of an external supply voltage and an internal supply voltage as a selected supply voltage in response to a delay locking signal and a delay end signal where the internal supply voltage has a voltage level lower than a voltage level of the external supply voltage;
- a phase comparator configured to use the selected supply voltage from the supply voltage selector as power source, compare a phase of a source clock with a phase of a feedback clock, and generate the delay locking signal corresponding to the comparison result;
- a clock delay configured to use the selected supply voltage from the supply voltage selector as power source, and configured to delay the source clock in response to the delay locking signal for locking delay and output the delayed source clock as a delay locked clock, and configured to generate the delay end signal when a delay amount has reached a delay limit; and
- a delay replica model configured to reference a delay time of an output path of the source clock at the delay locked clock and output the reflected clock as the feedback clock,
- wherein a delay locking operation by the phase comparator, the clock delay and the delay replica model is substantially terminated when the supply voltage selector supplies the internal supply voltage in response to the delay end signal.

14. The delay locked loop circuit of claim 13, wherein the clock delay includes:
- a delay controller configured to change a value of a delay locking code formed of a plurality of bits in response to the delay locking signal; and
- a delay line configured to delay the source clock by as much as a delay amount corresponding to a value of the delay locking code and output the delayed clock as the delay locked clock, and configured to activate the delay end signal when the value of the delay locking code is greater than a value corresponding to the delay limit.

15. The delay locked loop circuit of claim 14, wherein the delay controller changes the value of the delay locking code in response to the delay locking signal at an update time, which is repeated at a predetermined interval while performing a delay locking operation, and
- wherein the delay controller does not change a value of the delay locking code regardless of the update time and the value of the delay locking signal after a delay locking operation terminates.

16. The delay locked loop circuit of claim 15, wherein the delay controller increases the value of the delay locking code when the delay locking signal is in an activation state at the update time, and
- wherein the delay controller decreases the value of the delay locking code when the delay locking signal is in an inactivation state at the update time.

17. The delay locked loop circuit of claim 13, wherein, while the delay end signal is in an inactivation state, the supply voltage selector supplies the external supply voltage as the selected supply voltage when a delay locking operation is performed corresponding to the delay locking signal, and
- wherein, while the delay end signal is in an inactivation state, the supply voltage selector supplies the internal supply voltage as the selected supply voltage when a delay locking operation terminates corresponding the delay locking signal.

18. The delay locked loop circuit of claim 17, wherein the supply voltage selector supplies the internal supply voltage as the selected supply voltage regardless of whether a delay locking operation is performed or not corresponding to the delay locking signal.

19. A delay locked loop circuit comprising:
- a clock driver configured to output an external clock as a source clock by driving the external clock during a delay locking enable period corresponding to a delay end signal and configured to output the external clock as a delay locked clock by driving the external clock during a delay locking disable period;
- a phase comparator configured to compare a phase of the source clock with a phase of a feedback clock and generate a delay locking signal corresponding to the comparison result;
- a clock delay configured to delay the source clock in response to the delay locking signal for locking delay and output the delayed clock as the delay locked clock and configured to generate a delay end signal when a delay amount has reached a delay limit; and
- a delay replica model configured to reflect a delay time of an output path of the source clock at the delay locked clock and output the reflected clock as the feedback clock,
- wherein a delay locking operation by the phase comparator, the clock delay and the delay replica model is substantially terminated when the clock driver outputs the external clock as the delay locked clock in response to the delay end signal.

20. The delay locked loop circuit of claim 19, wherein the clock delay includes:
- a delay controller configured to change a value of a delay locking code formed of a plurality of bits in response to the delay locking signal; and
- a delay line configured to delay the source clock by as much as a delay amount corresponding to a value of the delay locking code and output the delayed clock as the delay locked clock, and configured to activate the delay end signal when the value of the delay locking code is greater than a value corresponding to the delay limit.

21. The delay locked loop circuit of claim 20, wherein the delay controller changes the value of the delay locking code in response to the delay locking signal at an update time, which is repeated at a predetermined interval while performing a delay locking operation, and
wherein the delay controller does not change the value of the delay locking code, regardless of the update time and the value of the delay locking signal, after a delay locking operation terminates.

22. The delay locked loop circuit of claim 21, wherein the delay controller increases the value of the delay locking code when the delay locking signal is in an activation state at the update time, and
wherein the delay controller decreases the value of the delay locking code when the delay locking signal is in an inactivation state at the update time.

23. The delay locked loop circuit of claim 19, wherein the clock driver includes:
- a source clock driver configured to output the external clock as the source clock by driving the external clock in response to the delay end signal and a clock enable signal; and
- a delay locked clock driver configured to output the external clock as the delay locked clock by driving the external clock in response to the delay end signal.

24. The delay locked loop circuit of claim 23, wherein the source clock driver drives the external clock as the source clock when the delay end signal is inactivated while the clock enable signal is in an activation state,
wherein the source clock driver does not drive the external clock as the source clock when the delay end signal is activated while the clock enable signal in an activation state, and
wherein the source clock driver does not drive the external clock as the source clock, regardless of a logic level of the delay end signal, while the clock enable signal is in an inactivation state.

25. The delay locked loop circuit of claim 23, wherein the delay locked clock driver drives the external clock as the delay locked clock when the delay end signal is activated, and
wherein the delay locked clock driver does not drive the external clock as the delay locked clock when the delay end signal is inactivated.

26. The delay locked loop circuit of claim 25, wherein the delay locked clock driven through the delay locked clock driver is delayed by as much as a predetermined time compared to the external clock.

* * * * *